US011625198B1

(12) United States Patent
Gao

(10) Patent No.: US 11,625,198 B1
(45) Date of Patent: Apr. 11, 2023

(54) DETECTION CIRCUIT, DETECTION METHOD AND MEMORY DEVICE

(71) Applicant: CHANGXIN MEMORY TECHNOLOGIES, INC., Hefei (CN)

(72) Inventor: Enpeng Gao, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/806,721

(22) Filed: Jun. 13, 2022

Related U.S. Application Data

(63) Continuation of application No. PCT/CN2022/095119, filed on May 26, 2022.

(30) Foreign Application Priority Data

Apr. 2, 2022 (CN) .......................... 202210342506.5

(51) Int. Cl.
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| 9,268,636 | B2* | 2/2016 | Chung | G06F 11/073 |
| 9,367,438 | B2* | 6/2016 | Yamada | G06F 11/167 |
| 9,905,288 | B2 | 2/2018 | Ryu et al. | |
| 10,621,023 | B2* | 4/2020 | Tsern | G06F 3/0619 |
| 2013/0322160 | A1* | 12/2013 | Kim | G11C 29/783 365/154 |
| 2019/0188165 | A1 | 6/2019 | Venkatraman et al. | |

FOREIGN PATENT DOCUMENTS

| CN | 110865909 A | 3/2020 |
| CN | 111427805 A | 7/2020 |

OTHER PUBLICATIONS

China International Search Report and written opinion in Application No. PCT/CN2022/095119, dated Nov. 28, 2022.

* cited by examiner

*Primary Examiner* — Elias Mamo
(74) *Attorney, Agent, or Firm* — Syncoda LLC; Feng Ma

(57) ABSTRACT

A mode register data processing module is configured to write, in response to a mode register write enable command, first preset data into a reserved mode register in a mode register; an external data transmission module is configured to write, in response to an enable signal, initial data into a memory array via an internal data transmission module according to the first preset data and a preset encoding rule, and is further configured to read target data from the memory array in response to a read command; and a comparison module is configured to determine whether there is an abnormal data transmission based on a comparison result of the first preset data and the target data, and store the comparison result to a preset position in the mode register.

20 Claims, 18 Drawing Sheets

DETECTION CIRCUIT, DETECTION METHOD AND MEMORY DEVICE

CROSS-REFERENCE TO RELATED APPLICATIONS

This is a continuation of International Application No. PCT/CN2022/095119 filed on May 26, 2022, which claims priority to Chinese Patent Application No. 202210342506.5 filed on Apr. 2, 2022. The disclosures of these applications are hereby incorporated by reference in their entirety.

BACKGROUND

With the rapid development of semiconductor technology, the density and number of memory cells in a memory cell array of a semiconductor memory device are continuously increasing to meet the market demand for the storage capacity of the semiconductor memory device.

However, as the density of the semiconductor memory device continues to increase, the memory cells show the characteristics of reduced physical volume, reduced stored charges, and reduced noise tolerance. Electromagnetic interaction between the memory cells has an increased impact on the memory cells, and the possibility of data loss in the memory cells increases. Design defects or manufacturing defects of semiconductor memory chips may increase the number of failed addresses in the memory chips, affecting the yield or reliability of the semiconductor memory chips.

If failed bits of the semiconductor memory chips can be found in time, the utilization efficiency and working reliability of the semiconductor memory chips will undoubtedly be effectively improved.

SUMMARY

The present disclosure relates to, but is not limited to, a detection circuit, a detection method and a memory device.

An overview of the subject matter detailed in the present disclosure is provided below, which is not intended to limit the protection scope of the claims.

The present disclosure provides a detection circuit, a detection method and a memory device.

A first aspect of the present disclosure provides a detection circuit, including a mode register data processing module, an external data transmission module, a comparison module, and an internal data transmission module provided in a memory array. The mode register data processing module is configured to write, in response to a mode register write enable command, first preset data into a reserved mode register in a mode register; the external data transmission module is electrically connected to both the reserved mode register and the internal data transmission module, is configured to write, in response to an enable signal, initial data into the memory array via the internal data transmission module according to the first preset data and a preset encoding rule, and is further configured to read target data from the memory array in response to a read command, wherein a number of bytes of the initial data is greater than a number of bytes of the first preset data; and the comparison module is electrically connected to both the mode register and the external data transmission module, and is configured to compare the first preset data with the target data, determine whether there is an abnormal data transmission based on a comparison result, and store the comparison result to a preset position in the mode register.

A second aspect of the present disclosure provides a memory device, including a memory array, a mode register, and the detection circuit according to any embodiment of the first aspect.

A third aspect of the present disclosure provides a detection method, including: controlling a mode register data processing module to write, in response to a mode register write enable command, first preset data into a reserved mode register in a mode register; controlling an external data transmission module to write, in response to an enable signal, initial data into a memory array via an internal data transmission module according to the first preset data and a preset encoding rule, and to read target data from the memory array in response to a read command, wherein a number of bytes of the initial data is greater than a number of bytes of the first preset data; and comparing the first preset data with the target data, determining whether there is an abnormal data transmission based on a comparison result, and storing the comparison result to a preset position in the mode register.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

REFERENCE NUMERALS

10. Mode register data processing module; 20. External data transmission module; 21. Preset data transmission module; 22. First data transmission module; 23. Second data transmission module; 24. General data transmission module; 25. Read module; 241. First general data transmission module; 242. Second general data transmission module; 30. Internal data transmission module; 40. Comparison module; 200. Mode register; 300. Memory array; 211. First preset data transmission unit; 21K. K-th preset data transmission unit; 21N2. N2-th preset data transmission unit; 31. First internal data transmission unit; 3m. m-th internal data transmission unit; and 3N2. N2-th internal data transmission unit.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In a low power double data rate SDRAM (LPDDR5), a control command informs positioning information of a monitoring mode register command MR21. After it is determined that the monitoring mode register command MR21 meets the condition, a Write X command is introduced, and then a column address strobe (CAS) command is received. According to high and low values of WXSA (determining low 8-bit data) and WXSB (determining high 8-bit data) bits of WRX in the CAS command, it is determined that 1 or 0 is written to the corresponding data in the specified column address. With this function, it is possible to write a large amount of repeated data into a memory array, such as all "0" or all "1". However, for writing other preset data into the memory array, CAS_Write X cannot do anything. The present disclosure is intended to timely discover whether there is abnormal data transmission in the memory array after the preset data is written into the memory array during the design of semiconductor memory chips or before the mass production of the semiconductor memory chips, and to discover failed bits in the memory array to effectively improve the design efficiency, production yield and reliability of the semiconductor memory chips.

Figure 1:
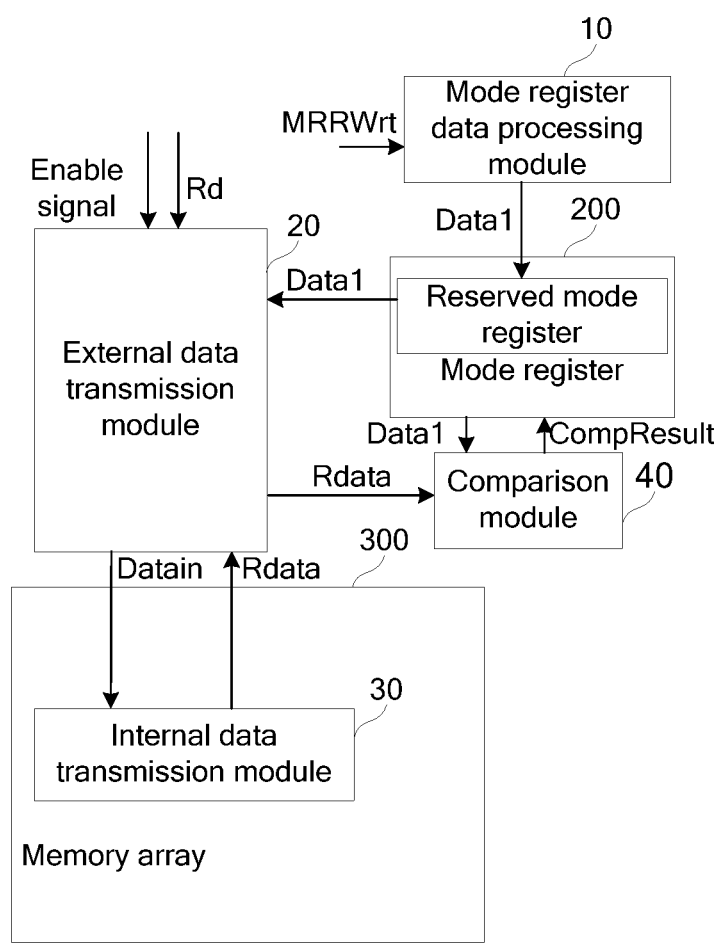
FIG. 1 is a schematic diagram of a circuit principle of a detection circuit according to a first embodiment of the present disclosure.

Please referring to FIG. 1, one embodiment of the present disclosure provides a detection circuit, including a mode register data processing module 10, an external data transmission module 20, a comparison module 40, and an internal data transmission module 30 provided in a memory array 300. The mode register data processing module 10 is configured to write, in response to a mode register write enable command MRRWrt, first preset data Data1 into a reserved mode register in a mode register 200; the external data transmission module 20 is electrically connected to both the reserved mode register and the internal data transmission module 30, is configured to write, in response to an enable signal, initial data Datain into the memory array 300 via the internal data transmission module 30 according to the first preset data Data1 and a preset encoding rule, and is further configured to read target data Rdata from the memory array 300 in response to a read command Rd, where the number of bytes of the initial data Datain is greater than the number of bytes of the first preset data Data; and the comparison module 40 is electrically connected to both the mode register 200 and the external data transmission module 20, and is configured to compare the first preset data Data1 with the target data Rdata, determine whether there is abnormal data transmission based on a comparison result CompResult, and store the comparison result CompResult to a preset position in the mode register 200. This embodiment can intelligently detect whether the memory array 300 is abnormal during data transmission, and store a detection result to the preset position in the mode register 200, so that it is convenient to analyze the failed bits in the memory array 300 according to the detection result stored in the mode register 200, thereby improving the utilization efficiency and working reliability of the semiconductor memory chips.

In some exemplary implementations, please still referring to FIG. 1, the comparison module 40 is configured to: generate the initial data Datain according to the first preset data Data1 and the preset encoding rule, compare the initial data Datain with the target data Rdata, and determine whether there is abnormal data transmission based on a comparison result CompResult, where the number of bytes of the initial data Datain is associated with the number of bytes of the target data Rdata. In this embodiment, the initial data Datain having the number of bytes associated with the number of bytes of the target data Rdata is generated according to the first preset data Data1 and the preset encoding rule, so as to obtain the comparison result CompResult by comparing whether the data at the corresponding bits in the initial data Datain and the target data Rdata are equal, and to determine whether there is abnormal data transmission in the memory array 300 based on the comparison result CompResult, thereby improving the accuracy of the obtained comparison result CompResult while reducing the obtaining complexity of the comparison result CompResult.

In some exemplary implementations, please still referring to FIG. 1, the number of bytes of the initial data Datain is equal to the number of bytes of the target data Rdata. The comparison module 40 is further configured to: compare the initial data Datain and the target data Rdata bit by bit, and if the initial data Datain and the target data Rdata are equal in each bit, determine that the data transmission is normal; and otherwise, determine that the data transmission is abnormal. The number of bytes of the initial data Datain is set to be equal to the number of bytes of the target data Rdata, and the initial data Datain and the target data Rdata are compared bit by bit to generate the comparison result CompResult, thereby improving the accuracy of the obtained comparison result CompResult while reducing the obtaining complexity of the comparison result CompResult.

In some exemplary implementations, please still referring to FIG. 1, the LPDDR5 defines 128 mode registers having a 8-bit width, where some of the mode registers that are not effectively used are generally used as reserved mode registers. Since the reserved mode register in the mode register 200 and the conventional mode register write enable command MRRWrt are configured to complete the function of writing the initial data Datain into the memory array 300, and the content of the initial data Datain can be changed by setting different encoding rules, the function of writing arbitrary data into the memory array 300 without a data strobe clock signal (WCK) or a data clock signal (DQ) and without increasing the complexity of a circuit structure is achieved, thereby effectively improving the storage performance of a semiconductor memory device. Since a low-power-consumption write function of the enable signal is used, this embodiment reduces the energy consumption of data transmission on the premise of ensuring the storage capacity of the semiconductor memory device.

Figure 2:
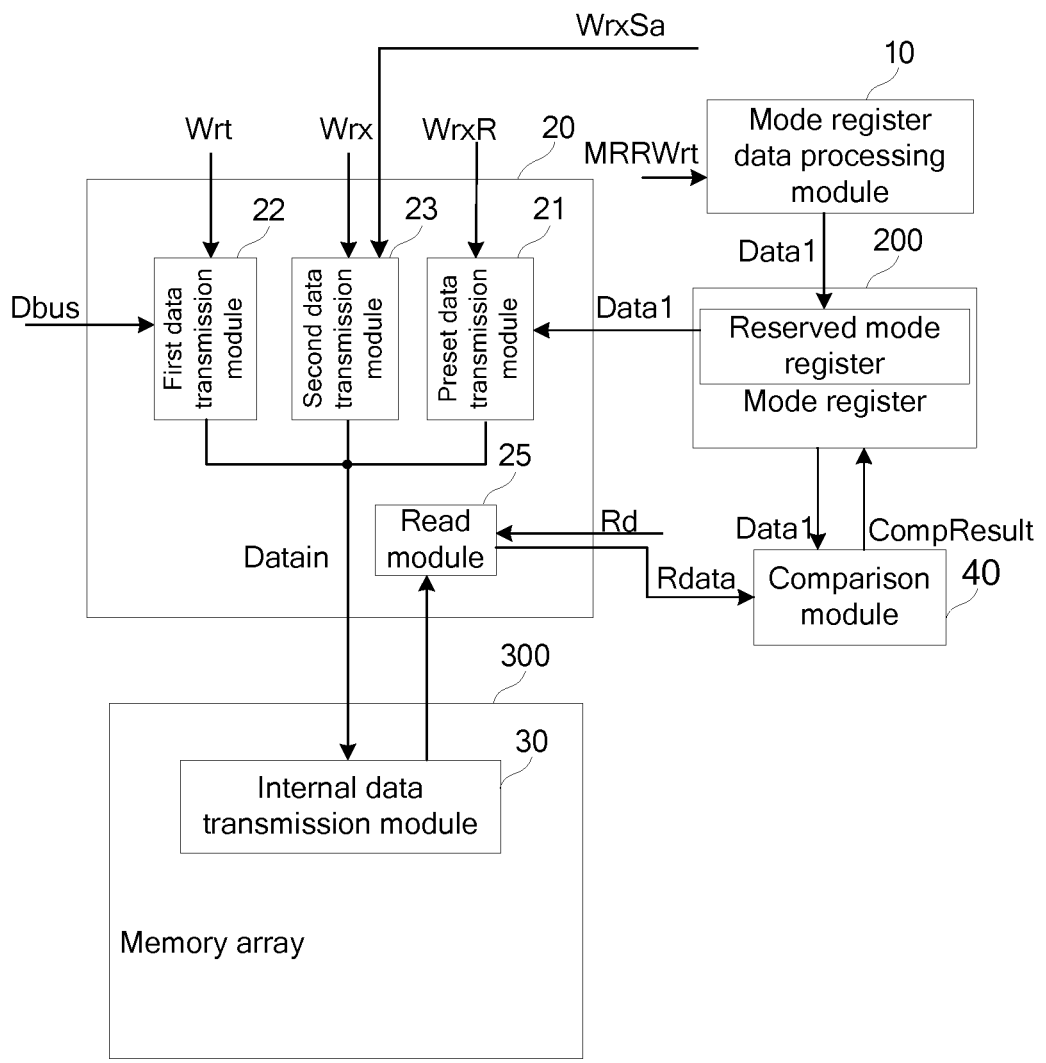
FIG. 2 is a schematic diagram of a circuit principle of a detection circuit according to a second embodiment of the present disclosure.

In some exemplary implementations, please still referring to FIG. 2, the number of bytes of the first preset data Data1 is N1; and the number of bytes of the target data Rdata is N2. The external data transmission module 20 includes a preset data transmission module 21 including N2 preset data transmission units. Each bit of data of the first preset data Data1 is electrically connected to an input terminal of the internal data transmission module 30 via corresponding N3 preset data transmission units, wherein N3=N2/N1; and N1, N2, and N3 are all positive integers. This embodiment reduces the complexity of writing the target data into the memory array 300 according to the initial data, and reduces the complexity of the comparison module generating the initial data according to the first preset data.

In some exemplary implementations, the preset data transmission module can be placed inside or outside the memory array. The embodiments of the present disclosure are intended to exemplarily describe the implementation principle, and do not specifically limit the specific position of the preset data transmission module.

In some exemplary implementations, please still referring to FIG. 2, the enable signal further includes a write enable signal Wrt. The external data transmission module 20 further includes a first data transmission module 22 including first data transmission units, where the number of first data transmission units is equal to the number of bytes of the initial data Datain, such as N2. The first data transmission unit is provided with an input terminal electrically connected to a corresponding data bus Dbus, an output terminal electrically connected to the internal data transmission module 30, and a control terminal for receiving the write enable signal Wrt, and is configured to provide, in response to the write enable signal Wrt, corresponding data to the internal data transmission module 30 according to the data provided by the corresponding data bus Dbus. In this embodiment, the first data transmission module 22 responds to the write enable signal Wrt and transmits the data provided by the data bus Dbus, so as to write the data into the memory array with low power consumption and meet storage data write requirements in different application scenarios.

In some exemplary implementations, please still referring to FIG. 2, the enable signal further includes a low-power-consumption write enable signal Wrt. The external data transmission module 20 further includes a second data transmission module 23 including second data transmission units, where the number of the second data transmission units is equal to the number of bytes of the initial data Datain, such as N2. The second data transmission unit is provided with an input terminal electrically connected to a corresponding low-power-consumption data line WrxSa, an output terminal electrically connected to the internal data transmission module 30, and a control terminal for receiving the low-power-consumption write enable signal Wrt, and is configured to provide, in response to the low-power-consumption write enable signal Wrt, corresponding data to the internal data transmission module 30 according to the data provided by the corresponding low-power-consumption data line WrxSa. The low-power-consumption data line WrxSa can be electrically connected to a data pad of a memory via other functional elements, so that the data pad receives the data from the external of the memory. Or, the low-power-consumption data line WrxSa can be electrically connected to the mode register for receiving the data provided by the mode register, thereby achieving the function of the second data transmission module 23 responding to the low-power-consumption write enable signal Wrt and transmitting the data provided by the low-power-consumption data line WrxSa according to specific application scenarios.

In some exemplary implementations, please still referring to FIG. 2, the external data transmission module 20 further includes a read module 25 including read units, where the number of the read units is equal to the number of bytes of the initial data Datain, such as N2. The read unit is configured to read the target data Rdata from the memory array 300 in response to the read command Rd and provide the target data Rdata to the comparison module 40, so that the comparison module 40 compares the first preset data Data1 with the target data Rdata, determines, according to the comparison result CompResult, whether there is abnormal data transmission, and stores the comparison result CompResult to the preset position in the mode register 200. The read module 25 can be electrically connected to the internal data transmission module 30, and a read-write conversion module (not shown in the figure) reads the target data Rdata from the memory array 300 via the internal data transmission module 30. In some other embodiments of the present disclosure, the read module 25 can also be electrically connected to the memory array 300 directly or via other functional elements.

Figure 3:
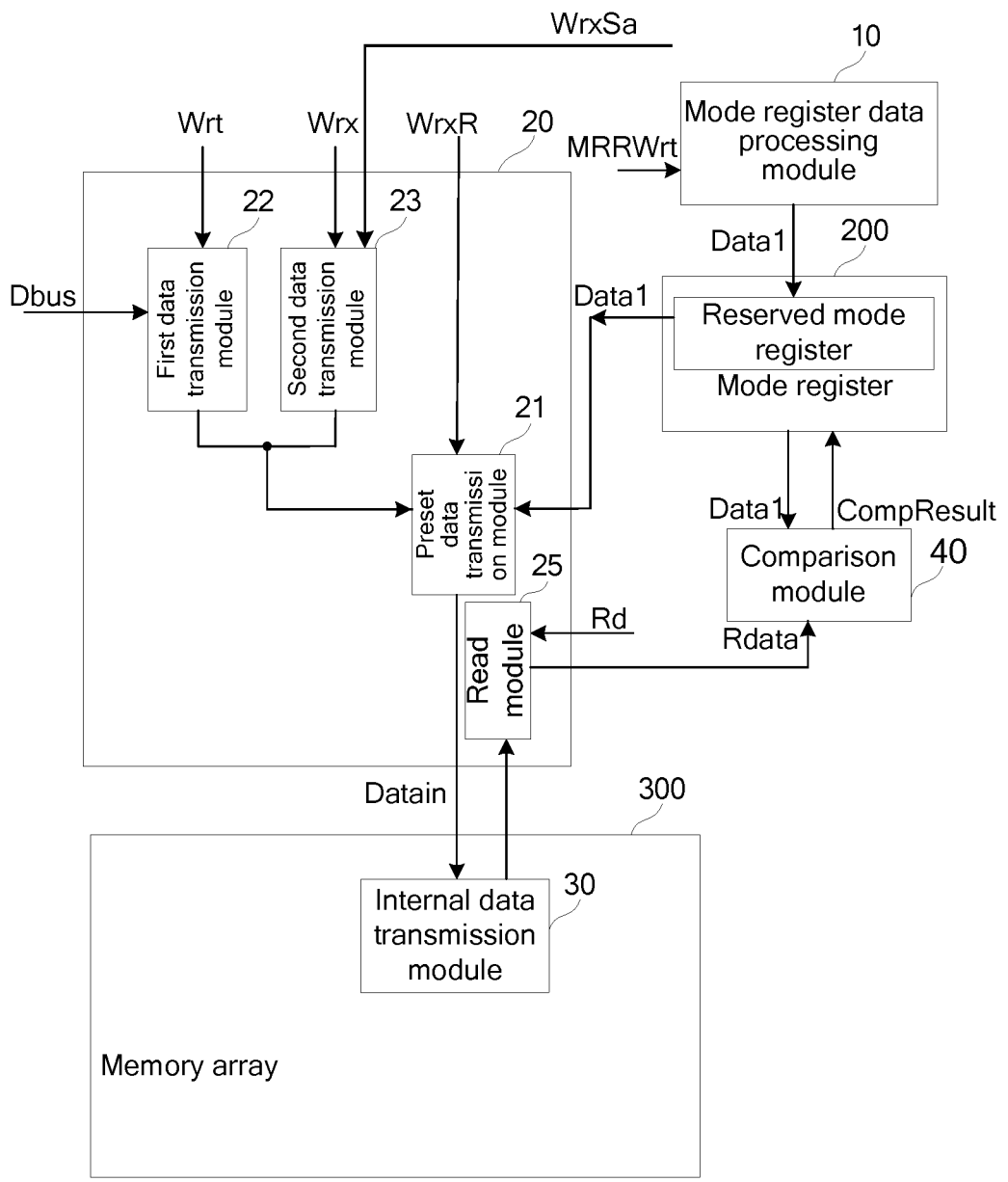
FIG. 3 is a schematic diagram of a circuit principle of a detection circuit according to a third embodiment of the present disclosure.

In some exemplary implementations, please referring to FIG. 3, the enable signal further includes a write enable signal Wrt. The external data transmission module 20 further includes a first data transmission module 22 including first data transmission units, where the number of the first data transmission units is equal to the number of bytes of the initial data Datain, such as N2. The first data transmission unit is provided with an input terminal electrically connected to a corresponding data bus Dbus, an output terminal electrically connected to the internal data transmission module 30 via the preset data transmission module 21, and a control terminal for receiving the write enable signal Wrt, and is configured to provide, in response to the write enable signal Wrt, corresponding data to the internal data transmission module 30 according to the data provided by the corresponding data bus Dbus. In this embodiment, the first data transmission module 22 responds to the write enable signal Wrt and transmits the data provided by the data bus Dbus, so as to write the data into the memory array with low power consumption and meet storage data write requirements in different application scenarios.

In some exemplary implementations, please still referring to FIG. 3, the enable signal further includes a low-power-consumption write enable signal Wrt. The external data transmission module 20 further includes a second data transmission module 23 including second data transmission units, where the number of the second data transmission units is equal to the number of bytes of the initial data Datain, such as N2. The second data transmission unit is provided with an input terminal electrically connected to a corresponding low-power-consumption data line WrxSa, an output terminal electrically connected to the internal data transmission module 30 via the preset data transmission module 21, and a control terminal for receiving the low-power-consumption write enable signal Wrt, and is configured to provide, in response to the low-power-consumption write enable signal Wrt, corresponding data to the internal data transmission module 30 according to the data provided by the corresponding low-power-consumption data line WrxSa. The low-power-consumption data line WrxSa can be electrically connected to a data pad of a memory via other functional elements, so that the data pad receives the data from the external of the memory. Or, the low-power-consumption data line WrxSa can be electrically connected to the mode register for receiving the data provided by the mode register, thereby achieving the function of the second data transmission module 23 responding to the low-power-consumption write enable signal Wrt and transmitting the data provided by the low-power-consumption data line WrxSa according to specific application scenarios.

Figure 4:
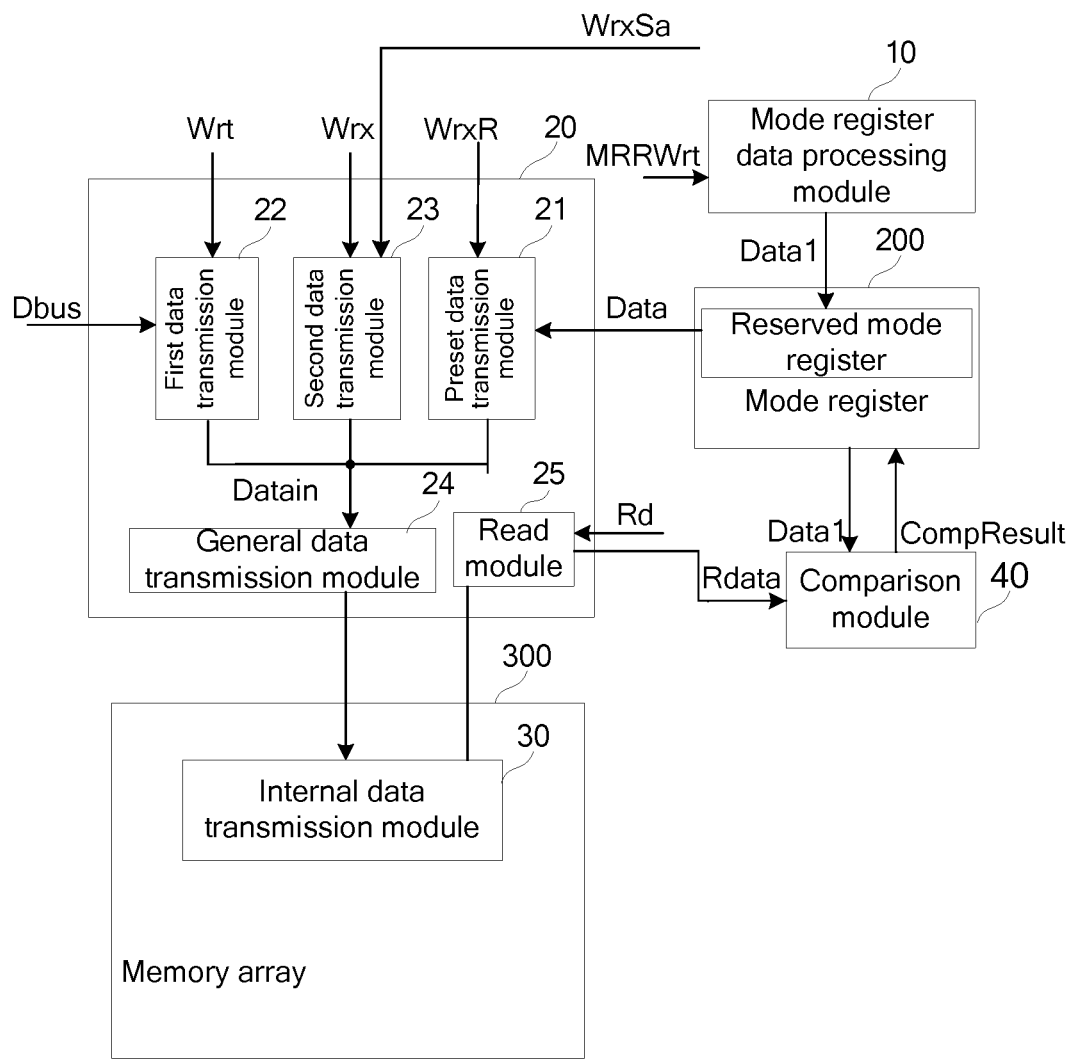
FIG. 4 is a schematic diagram of a circuit principle of a detection circuit according to a fourth embodiment of the present disclosure.

In some exemplary implementations, please referring to FIG. 4, the enable signal further includes a write enable signal Wrt. The external data transmission module 20 further includes a first data transmission module 22 including first data transmission units, where the number of the first data transmission units is equal to the number of bytes of the initial data Datain, such as N2. The first data transmission unit is provided with an input terminal electrically connected to a corresponding data bus Dbus, an output terminal electrically connected to the internal data transmission module 30 via the general data transmission module 24, and a control terminal for receiving the write enable signal Wrt, and is configured to provide, in response to the write enable signal Wrt, corresponding data to the internal data transmission module 30 according to the data provided by the corresponding data bus Dbus. In this embodiment, the first data transmission module 22 responds to the write enable signal Wrt and transmits the data provided by the data bus Dbus, so as to write the data into the memory array with low power consumption and meet storage data write requirements in different application scenarios.

In some exemplary implementations, please still referring to FIG. 4, the enable signal further includes a low-power-consumption write enable signal Wrt. The external data transmission module 20 further includes a second data transmission module 23 including second data transmission units, where the number of the second data transmission units is equal to the number of bytes of the initial data Datain, such as N2. The second data transmission unit is provided with an input terminal electrically connected to a corresponding low-power-consumption data line WrxSa, an output terminal electrically connected to the internal data transmission module 30 via the general data transmission module 24, and a control terminal for receiving the low-power-consumption write enable signal Wrt, and is configured to provide, in response to the low-power-consumption write enable signal Wrt, corresponding data to the internal data transmission module 30 according to the data provided by the corresponding low-power-consumption data line WrxSa. The low-power-consumption data line WrxSa can be electrically connected to a data pad of a memory via other functional elements, so that the data pad receives the data from the external of the memory. Or, the low-power-consumption data line WrxSa can be electrically connected to the mode register for receiving the data provided by the mode register, thereby achieving the function of the second data transmission module 23 responding to the low-power-consumption write enable signal Wrt and transmitting the data provided by the low-power-consumption data line WrxSa according to specific application scenarios.

Figure 5:
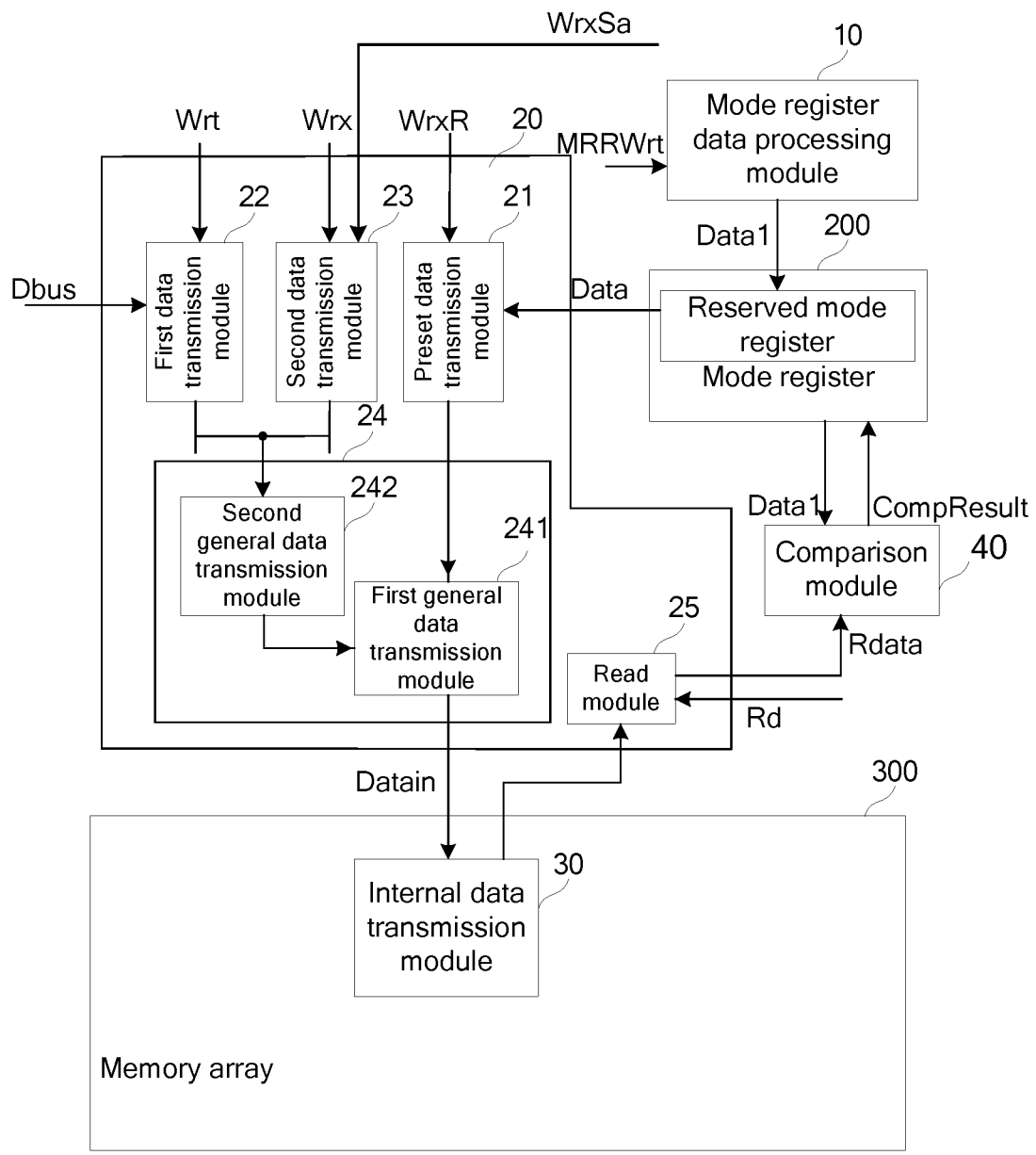
FIG. 5 is a schematic diagram of a circuit principle of a detection circuit according to a fifth embodiment of the present disclosure.

In some exemplary implementations, please referring to FIG. 5, the general data transmission module 24 includes a first general data transmission module 241 and a second general data transmission module 242. The first general data transmission module 241 is provided with a first input terminal connected to an output terminal of the preset data transmission module 21 and an output terminal connected to an input terminal of the internal data transmission module 30. The second general data transmission module 242 is provided with a first input terminal connected to an output terminal of the first data transmission module 22, a second input terminal connected to an output terminal of the second data transmission module 23, and an output terminal connected to a second input terminal of the first general data transmission module 241. This embodiment is convenient to achieve the function of writing arbitrary target data into the memory array by means of the existing functional elements inside the specific application circuit, which reduces the circuit cost and is suitable for the actual needs of various different application scenarios.

Figure 6A:
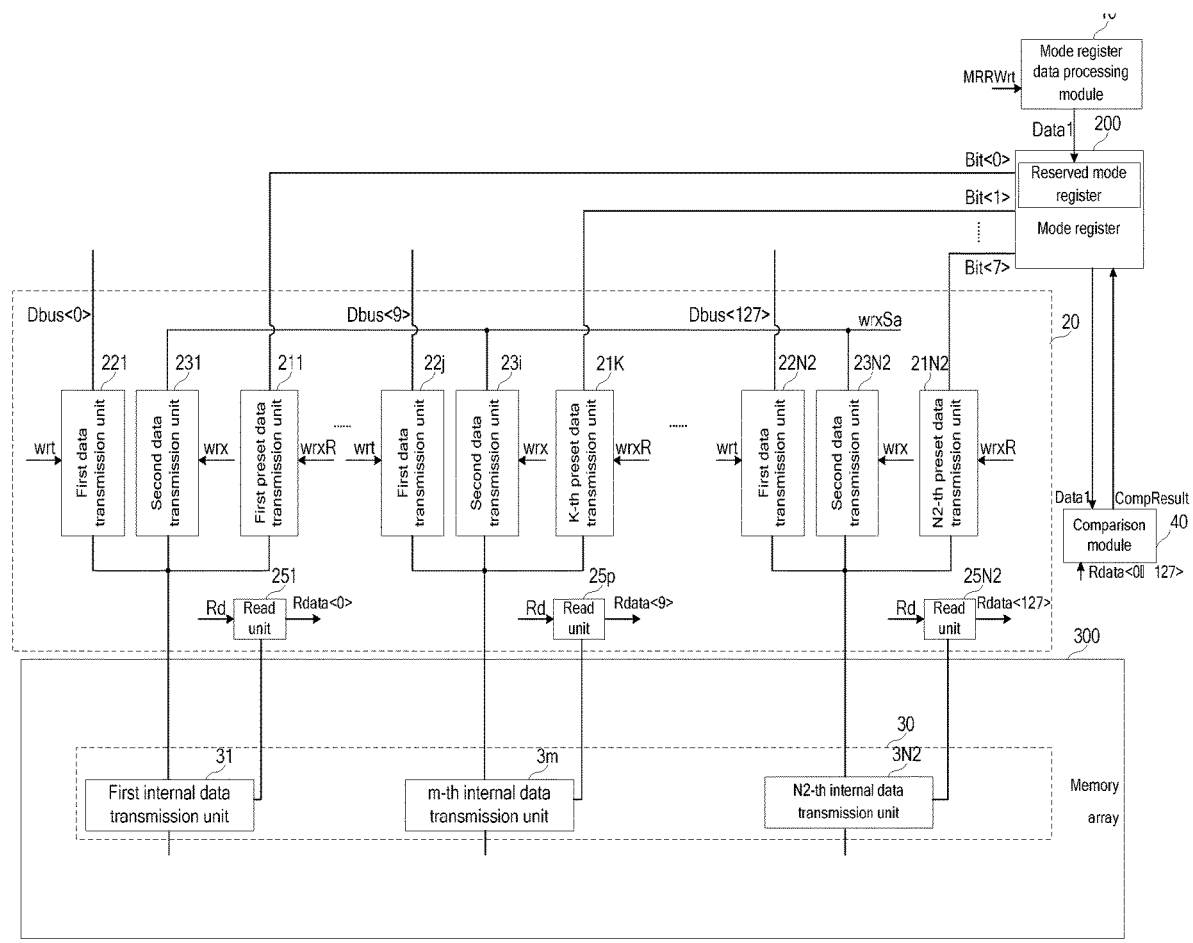
FIG. 6A is a first schematic diagram of a circuit principle corresponding to the embodiment shown in FIG. 2.
Figure 6B:
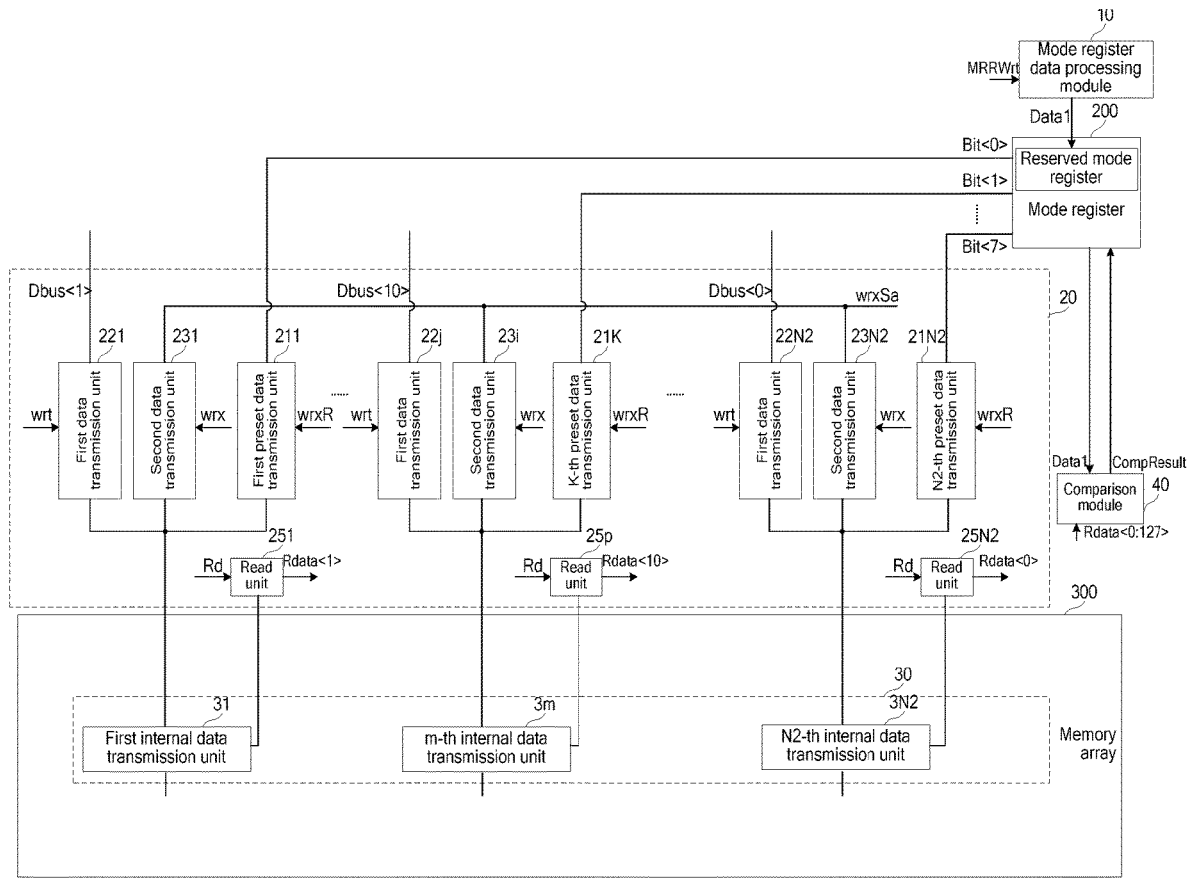
FIG. 6B is a second schematic diagram of a circuit principle corresponding to the embodiment shown in FIG. 2.

In some exemplary implementations, please referring to FIG. 6A and FIG. 6B, the number of bytes of the first preset data Data1 is N1; and the number of bytes of the initial data Datain is N2. The external data transmission module 20 includes N2 preset data transmission units, i.e., a first preset data transmission unit 211, a K-th preset data transmission unit 21K, and a N2-th preset data transmission unit 21N2, wherein 1≤K≤N2. Each bit of data Bit<0: 7> of the first preset data Data1 is transmitted to the internal data transmission module 30 via corresponding N3 preset data transmission units, and is transmitted to the memory array 300 via the internal data transmission module 30. That is, there are N3 preset data transmission units for transmitting Bit<0>, N3 preset data transmission units for transmitting Bit<1>, N3 preset data transmission units for transmitting Bit<2>, N3 preset data transmission units for transmitting Bit<3>, N3 preset data transmission units for transmitting Bit<4>, N3 preset data transmission units for transmitting Bit<5>, N3 preset data transmission units for transmitting Bit<6>, and N3 preset data transmission units for transmitting Bit<7>, where N3=N2/N1; and K, N1, N2, and N3 are all positive integers. In this embodiment, the initial data is written into the reserved mode register in the mode register 200, then each bit of data of the initial data is transmitted to the internal data transmission module 30 via the preset data transmission units and transmitted to the memory array 300 via the internal data transmission module 30, and the encoding relationship among the N3 preset data transmission units corresponding to each bit of the initial data can be set according to the content of the target data, thereby effectively reducing the setting complexity of encoding rules, and reducing the complexity of writing the initial data into the memory array according to the first preset data Data1.

In some exemplary implementations, please still referring to FIG. 6A and FIG. 6B, the internal data transmission module includes N2 internal data transmission units, i.e., a first internal data transmission unit, . . . , a m-th internal data transmission unit, . . . , and a N2-th internal data transmission unit, where N3=N2/N1; and 1≤j≤N2. The first data transmission module includes a first data transmission unit 221 . . . , a first data transmission unit 22j, . . . , and a first data transmission unit 22N2, where 1≤j≤N2. The second data transmission module includes a second data transmission unit 231 . . . , a second data transmission unit 23i, . . . , and a second data transmission unit 23N2, where 1≤i≤N2; and m, i, j, N1, N2, and N3 are all positive integers. An output terminal of the K-th preset data transmission unit 21K, an output terminal of the first data transmission unit 22j, and an output terminal of the second data transmission unit 23i are all connected to an input terminal of the corresponding m-th internal data transmission unit. In this embodiment, the encoding relationship among the N3 preset data transmission units corresponding to each bit of the initial data can be set according to the content of the target data, thereby effectively reducing the setting complexity of encoding rules, and reducing the complexity of writing the target data into the memory array 300 according to the first preset data Data1.

In some exemplary implementations, please still referring to FIG. 6A and FIG. 6B, the m-th internal data transmission unit may include one or more of a drive unit, a buffer, a read-write conversion unit, etc. The type and number of electrical elements included in the m-th internal data transmission unit can be determined according to functional elements in the actual circuits of the specific application scenarios. Those skilled in the art can undoubtedly determine that the equivalent/equal modifications made under the concept of the present disclosure all belong to the protection scope of the embodiments of the present disclosure.

In some exemplary implementations, please still referring to FIG. 6A and FIG. 6B, the number of the preset data transmission units corresponding to at least two bits of data of the first preset data is different, thereby improving the richness of encoding rules.

Figure 7A:
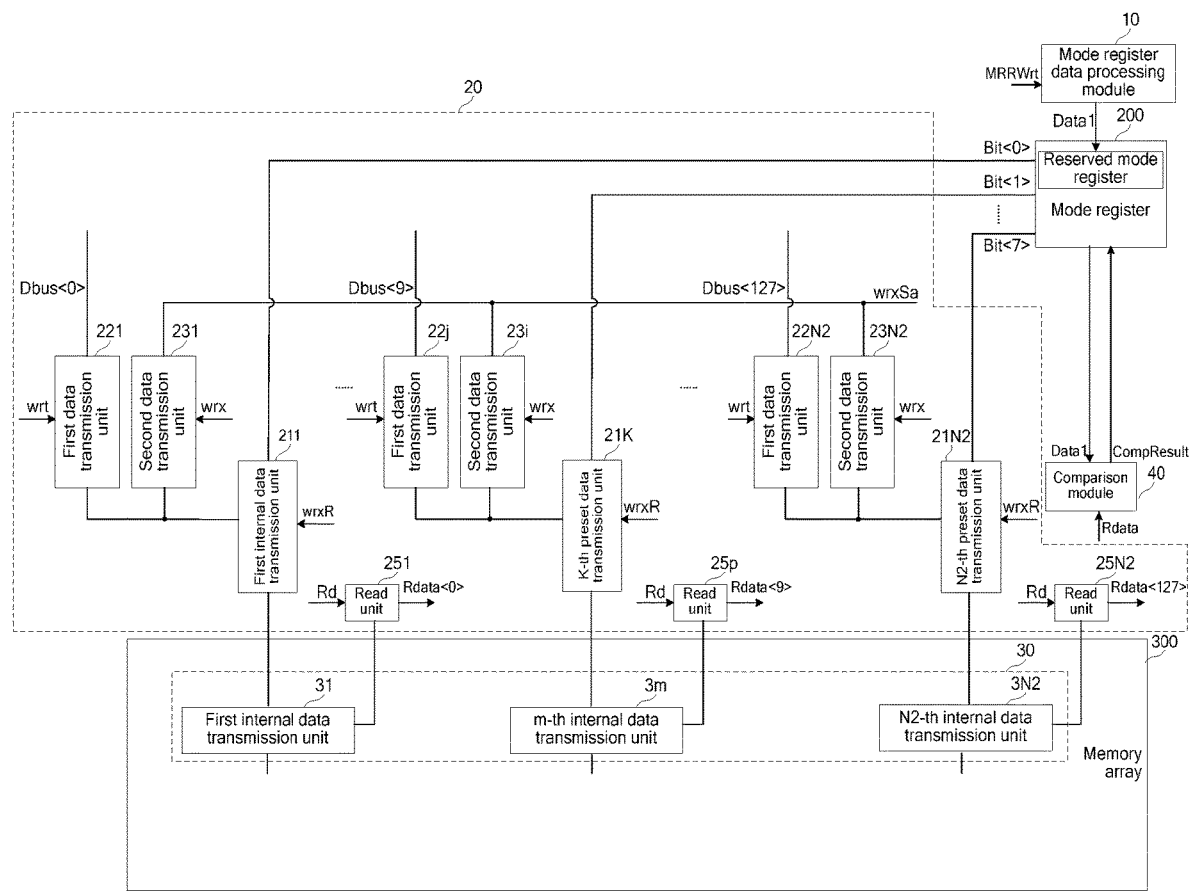
FIG. 7A is a first schematic diagram of a circuit principle corresponding to the embodiment shown in FIG. 3.
Figure 7B:
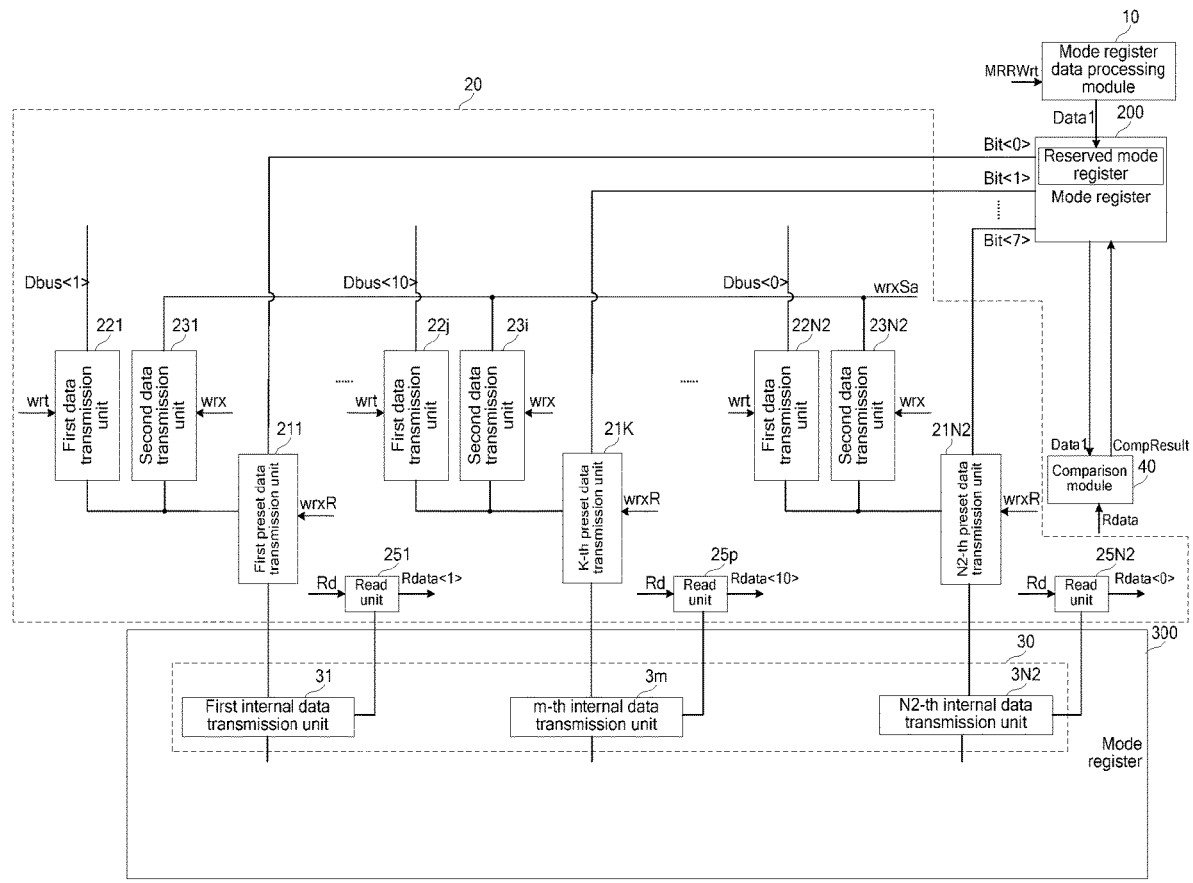
FIG. 7B is a second schematic diagram of a circuit principle corresponding to the embodiment shown in FIG. 3.

In some exemplary implementations, please referring to FIG. 7A and FIG. 7B, both an output terminal of the first data transmission unit 22j and an output terminal of the second data transmission unit 23i are electrically connected to an input terminal of the m-th internal data transmission unit via the corresponding K-th preset data transmission unit 21K, where 1≤K≤N2, 1≤m≤N2, 1≤i≤N2, 1≤j≤N2, and m, i, j, K, N1, N2, and N3 are all positive integers. In this embodiment, the initial data is written into the reserved mode register in the mode register 200, then each bit of the initial data is transmitted to the internal data transmission module 30 via the preset data transmission units and transmitted to the memory array 300 via the internal data transmission module 30, and the encoding relationship among the N3 preset data transmission units corresponding to each bit of the initial data can be set according to the content of the target data, thereby effectively reducing the setting complexity of encoding rules, and reducing the complexity of writing the initial data into the memory array according to the first preset data Data1.

Figure 8A:
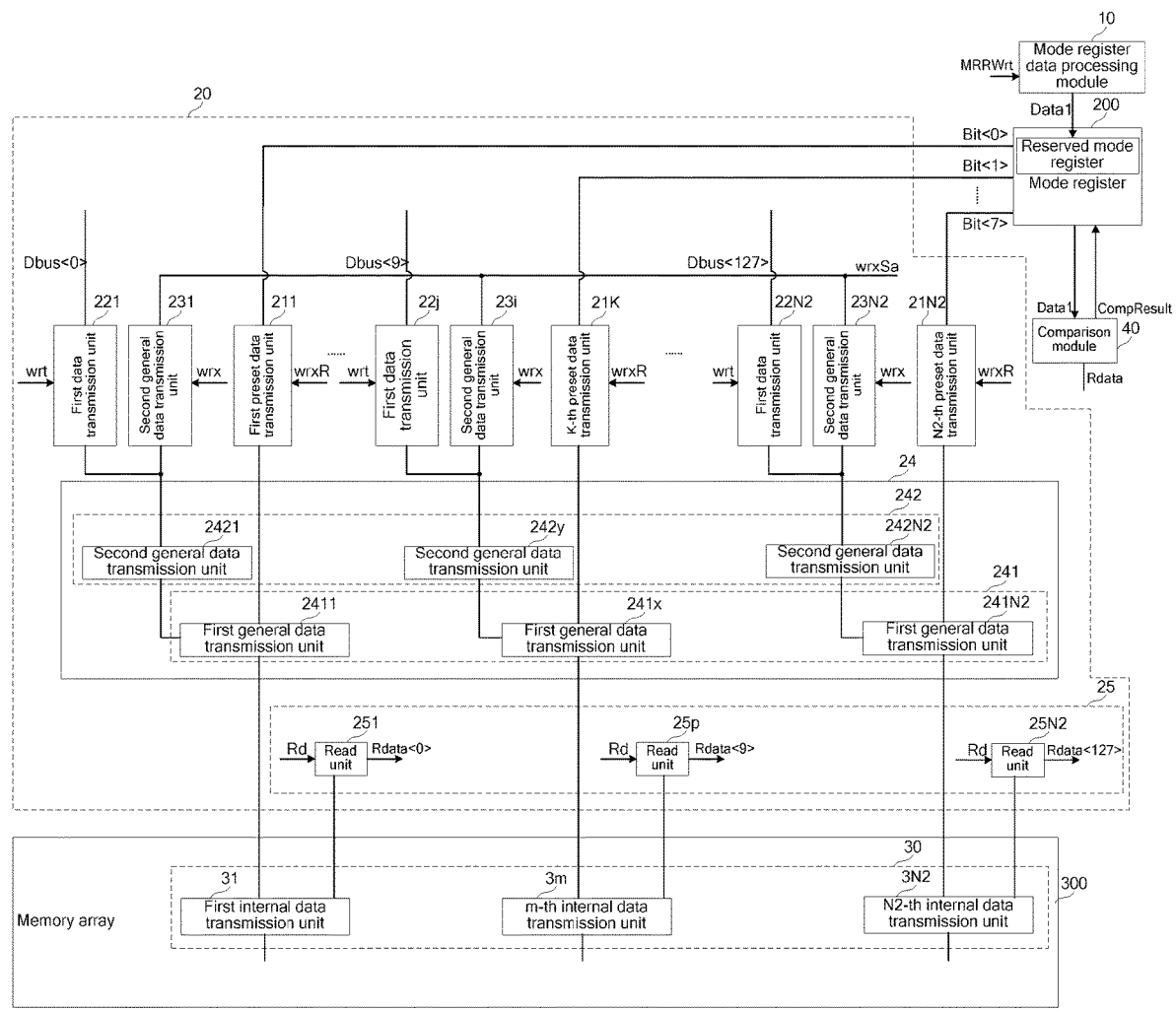
FIG. 8A is a first schematic diagram of a circuit principle corresponding to the embodiment shown in FIG. 5.
Figure 8B:
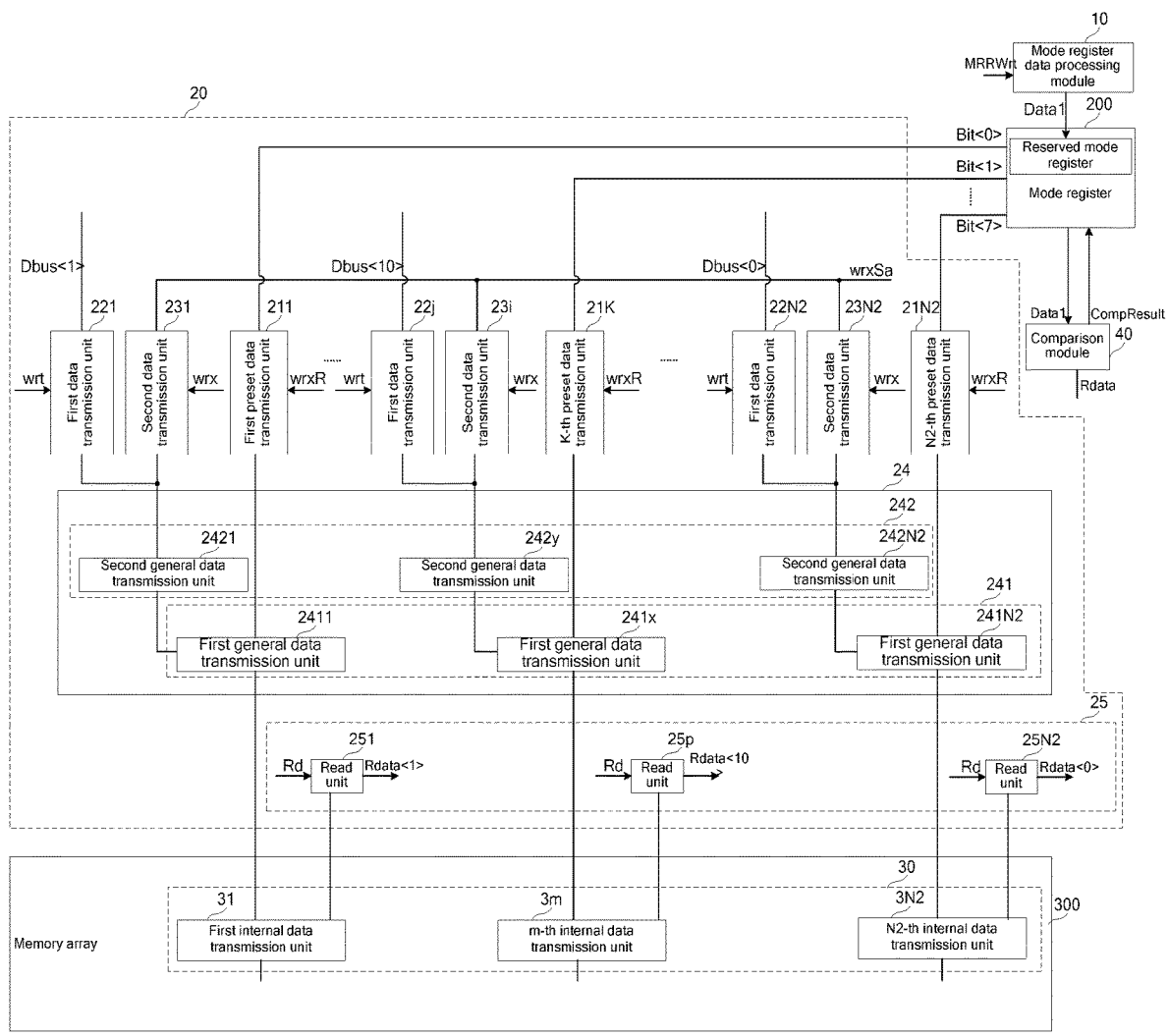
FIG. 8B is a second schematic diagram of a circuit principle corresponding to the embodiment shown in FIG. 5.

In some exemplary implementations, please referring to FIG. 8A and FIG. 8B, the first general data transmission module 241 includes a first general data transmission unit 2411, . . . , a first general data transmission unit 241x, . . . , and a first general data transmission unit 241 N2, where 1≤x≤N2. The second general data transmission module 242 includes a second general data transmission unit 2421, . . . , a second general data transmission unit 242y, . . . , and a second general data transmission unit 242N2, where 1≤y≤N2. An output terminal of the first data transmission unit 22j and an output terminal of the second data transmission unit 23i are electrically connected to an input terminal of the first general data transmission unit 241x via the second general data transmission unit 242y. The K-th preset data transmission unit 21K is electrically connected to an input terminal of the m-th internal data transmission unit via the first general data transmission unit 241x, where 1≤K≤N2, 1≤m≤N2, 1≤i≤N2, 1≤j≤N2, 1≤x≤N2, 1≤y≤N2, and m, i, j, K, x, y, N1, N2, and N3 are all positive integers. In this embodiment, the initial data is written into the reserved mode register in the mode register 200, then each bit of data of the initial data is transmitted to the internal data transmission module 30 via the preset data transmission units and transmitted to the memory array 300 via the internal data transmission module 30, and the encoding relationship among the N3 preset data transmission units corresponding to each bit of the initial data can be set according to the content of the target data, thereby effectively reducing the setting complexity of encoding rules, and reducing the complexity of writing the initial data into the memory array according to the first preset data Data1.

In some exemplary implementations, please referring to FIG. 8A and FIG. 8B, the first general data transmission unit 241x may include one or more of a drive unit, a buffer, a read-write conversion unit, etc. The type and number of electrical elements included in the first general data transmission unit 241x can be determined according to functional elements in the actual circuits of the specific application scenarios. Those skilled in the art can undoubtedly determine that the equivalent/equal modifications made under the concept of the present disclosure all belong to the protection scope of the embodiments of the present disclosure.

In some exemplary implementations, please referring to FIG. 8A and FIG. 8B, the second general data transmission unit 242y may include one or more of a drive unit, a buffer, a read-write conversion unit, etc. The type and number of electrical elements included in the first general data transmission unit 241x can be determined according to functional elements in the actual circuits of the specific application scenarios. Those skilled in the art can undoubtedly determine that the equivalent/equal modifications made under the concept of the present disclosure all belong to the protection scope of the embodiments of the present disclosure.

In some exemplary implementations, please referring to FIG. 8A and FIG. 8B, the first general data transmission module and the second general data transmission module are located inside the memory array. In other embodiments of the present disclosure, the first general data transmission module or the second general data transmission module is located outside the memory array. This embodiment is convenient to achieve the function of writing arbitrary target data into the memory array by means of the existing functional elements inside the specific application circuit, which reduces the circuit cost and is suitable for the actual needs of various different application scenarios.

In some exemplary implementations, please referring to FIG. 6A to FIG. 8B, the read module 25 includes N2 read units, i.e., a read unit 251, . . . , a read unit 25p, . . . , and a read unit 25N2. The read unit 25p is electrically connected to both an output terminal of the m-th internal data transmission unit and the comparison module 40, and is configured to read the target data Rdata from the memory array 300 in response to the read command Rd and provide the target data Rdata to the comparison module 40, where 1≤p≤N2, 1≤m≤N2, and m, p, N1, N2, and N3 are all positive integers. In this embodiment, it is convenient for the comparison module 40 to compare the first preset data Data1 with the target data Rdata, determine whether there is abnormal data transmission based on the comparison result CompResult, and store the comparison result CompResult to the preset position in the mode register 200.

Figure 9A:
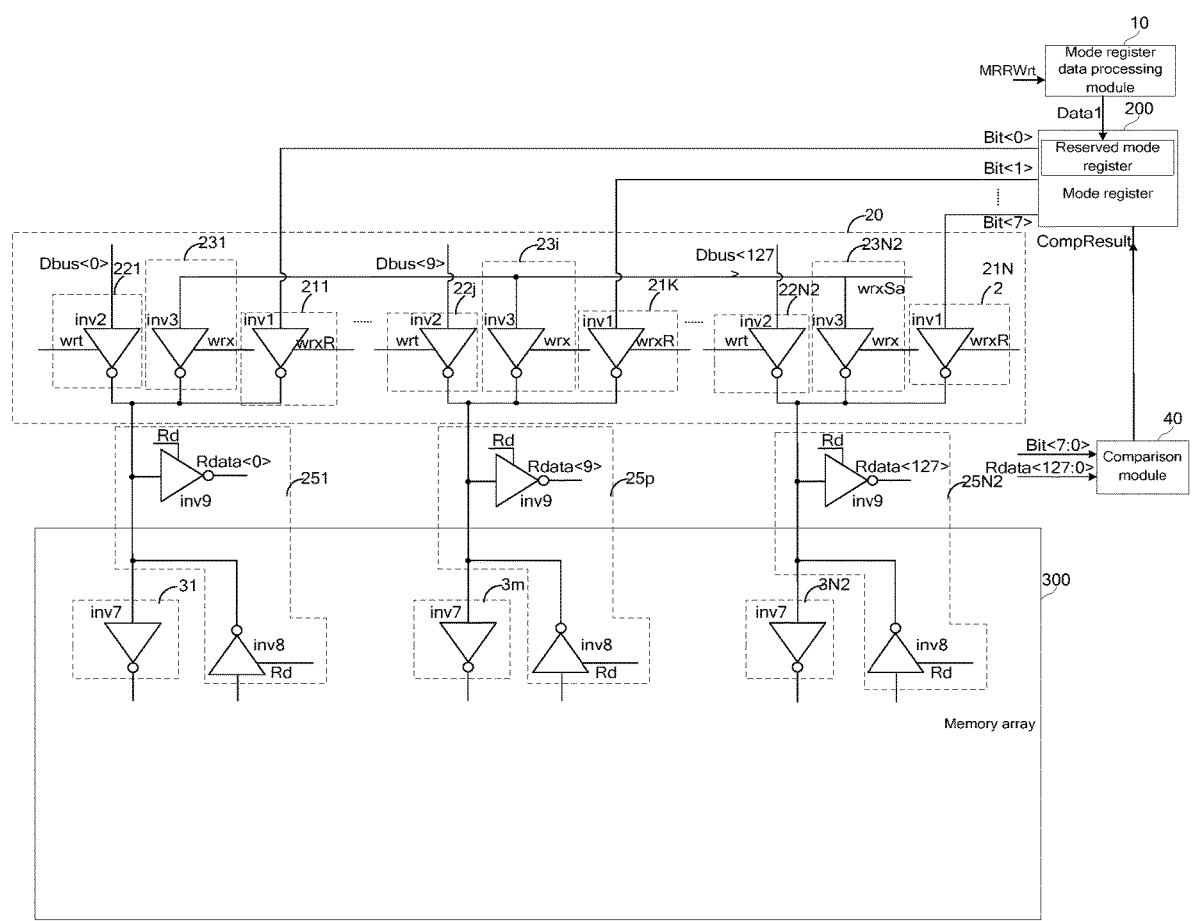
FIG. 9A is a first schematic diagram of a circuit corresponding to the embodiment shown in FIG. 2.
Figure 9B:
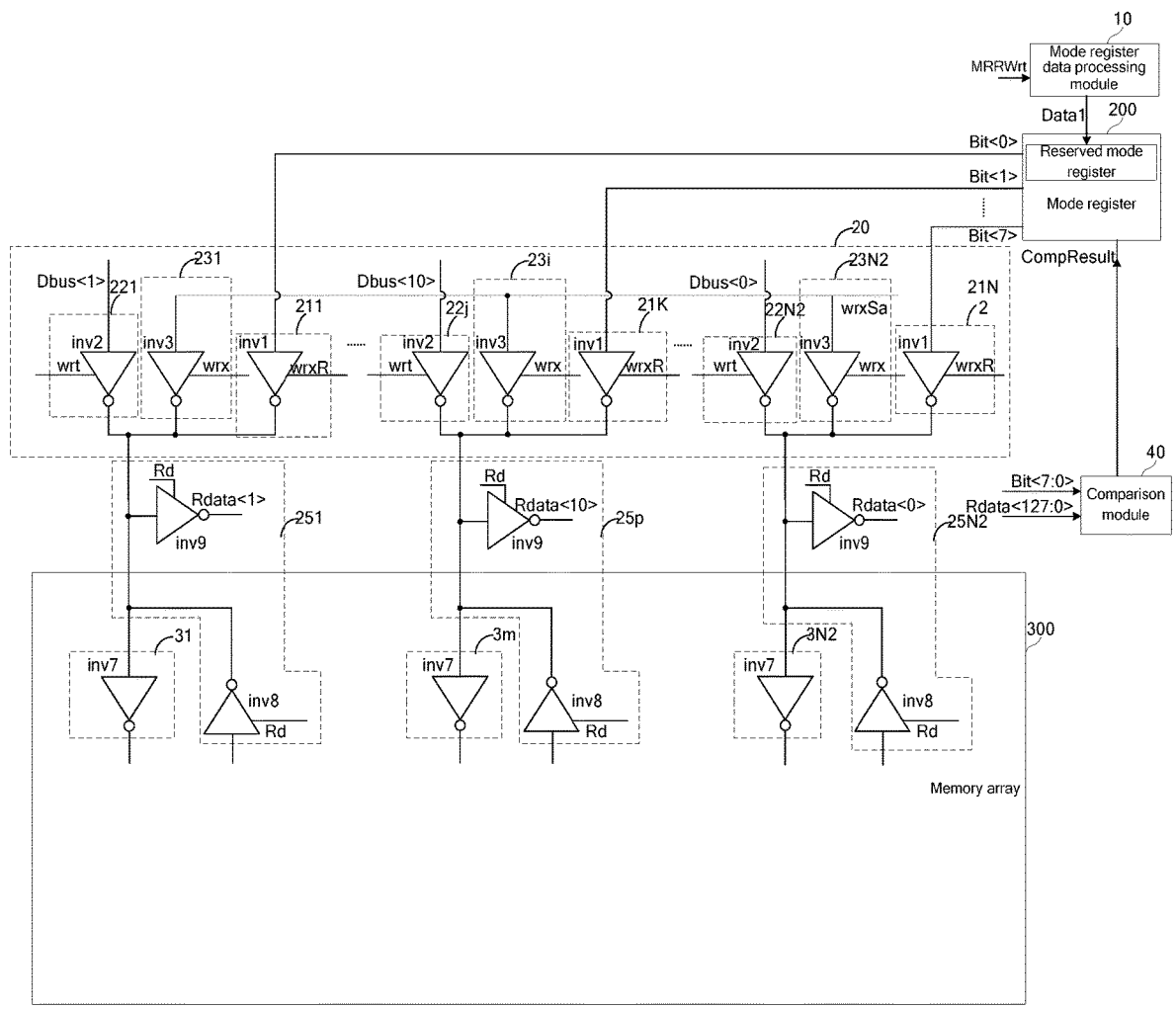
FIG. 9B is a second schematic diagram of a circuit corresponding to the embodiment shown in FIG. 2.

In some exemplary implementations, please referring to FIG. 9A and FIG. 9B, the enable signal includes a write enable command wrxR. The preset data transmission unit includes a first gating inverter inv1 provided with an input terminal electrically connected to the reserved mode register, an output terminal electrically connected to an input terminal of the internal data transmission module, and a control terminal for receiving the write enable command wrxR, and configured to write, in response to the write enable command wrxR, the target data into the memory array 300 via the internal data transmission module according to the received initial data and the preset encoding rule. This embodiment reduces the complexity of writing the target data into the memory array 300 according to the initial data.

In some exemplary implementations, please still referring to FIG. 9A and FIG. 9B, the first data transmission unit includes a second gating inverter inv2 provided with an input terminal electrically connected to a corresponding data bus, an output terminal electrically connected to the internal data transmission module 30, and a control terminal for receiving the write enable signal wrt, and configured to provide, in response to the write enable signal wrt, corresponding data to the internal data transmission module 30 according to the data provided by the corresponding data bus. The second data transmission unit includes a third gating inverter inv3 provided with an input terminal electrically connected to a corresponding low-power-consumption data line wrxSa, an output terminal electrically connected to the internal data transmission module 30, and a control terminal for receiving the low-power-consumption write enable signal wrx, and configured to provide, in response to the low-power-consumption write enable signal wrx, corresponding data to the internal data transmission module 30 according to the data provided by the corresponding low-power-consumption data line wrxSa. During a period when the low-power-consumption write enable signal wrx is at a high level, the third gating inverter inv3 provides corresponding data to the internal data transmission module 30 according to the data provided by the corresponding low-power-consumption data line wrxSa, and transmits the data to the memory array 300 via the internal data transmission module 30. During a period when the low-power-consumption write enable signal wrx is at a low level, the third gating inverter inv3 is in a high-resistance state. This embodiment implements low-power-consumption data transmission, thereby improving the energy-saving performance of the circuit while reducing the structural complexity of the circuit. The low-power-consumption data line WrxSa can be electrically connected to a data pad of a memory device via other functional elements, so that the data pad receives the data from the external of the memory. Or, the low-power-consumption data line WrxSa can be electrically connected to the mode register for receiving the data provided by the mode register, thereby achieving the function of the second data transmission module 23 responding to the low-power-consumption write enable signal Wrt and transmitting the data provided by the low-power-consumption data line WrxSa according to specific application scenarios.

In some exemplary implementations, please still referring to FIG. 9A and FIG. 9B, the read unit 25$p$ includes a fourth gating inverter inv8 and a fifth gating inverter inv9. The fourth gating inverter inv8 is provided with an input terminal electrically connected to the memory array, a control terminal for receiving the read command Rd, and an output terminal electrically connected to an input terminal of the m-th internal data transmission unit. The fifth gating inverter inv9 is provided with an input terminal electrically connected to an output terminal of the fourth gating inverter inv8, an output terminal electrically connected to an input terminal of the comparison module 40, and a control terminal for receiving the read command Rd. The fourth gating inverter inv8 and the fifth gating inverter inv9 are configured to read the target data Rdata from the memory array 300 in response to the read command Rd, and provide the target data Rdata to the comparison module 40, where 1≤p≤N2, 1≤m≤N2, and m, p, N1, N2, and N3 are all positive integers. In this embodiment, it is convenient for the comparison module 40 to compare the first preset data Data1 with the target data Rdata, determine whether there is abnormal data transmission based on the comparison result CompResult, and store the comparison result CompResult to the preset position in the mode register 200.

Figure 10A:
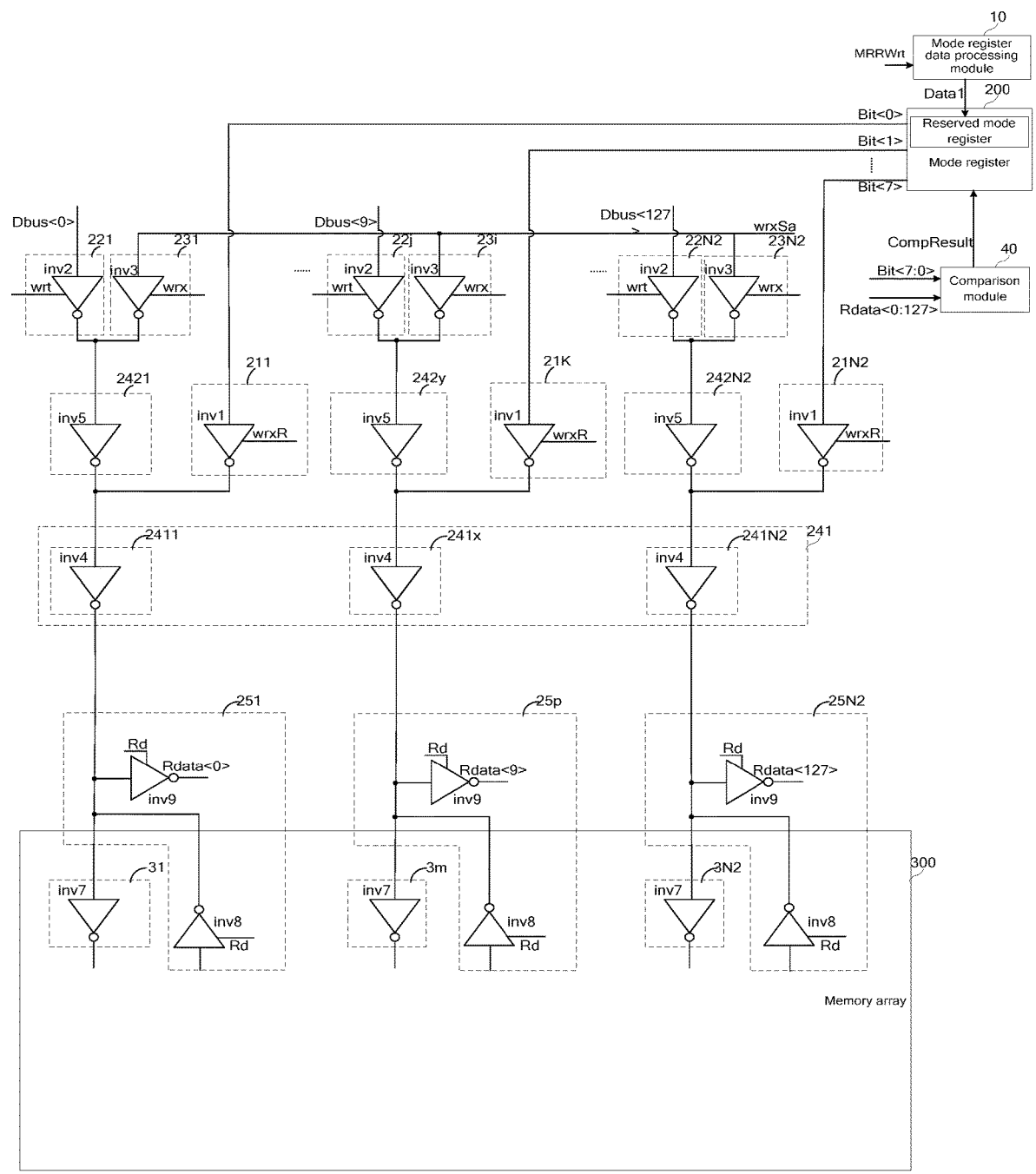
FIG. 10A is a first schematic diagram of a circuit corresponding to the embodiment shown in FIG. 5.
Figure 10B:
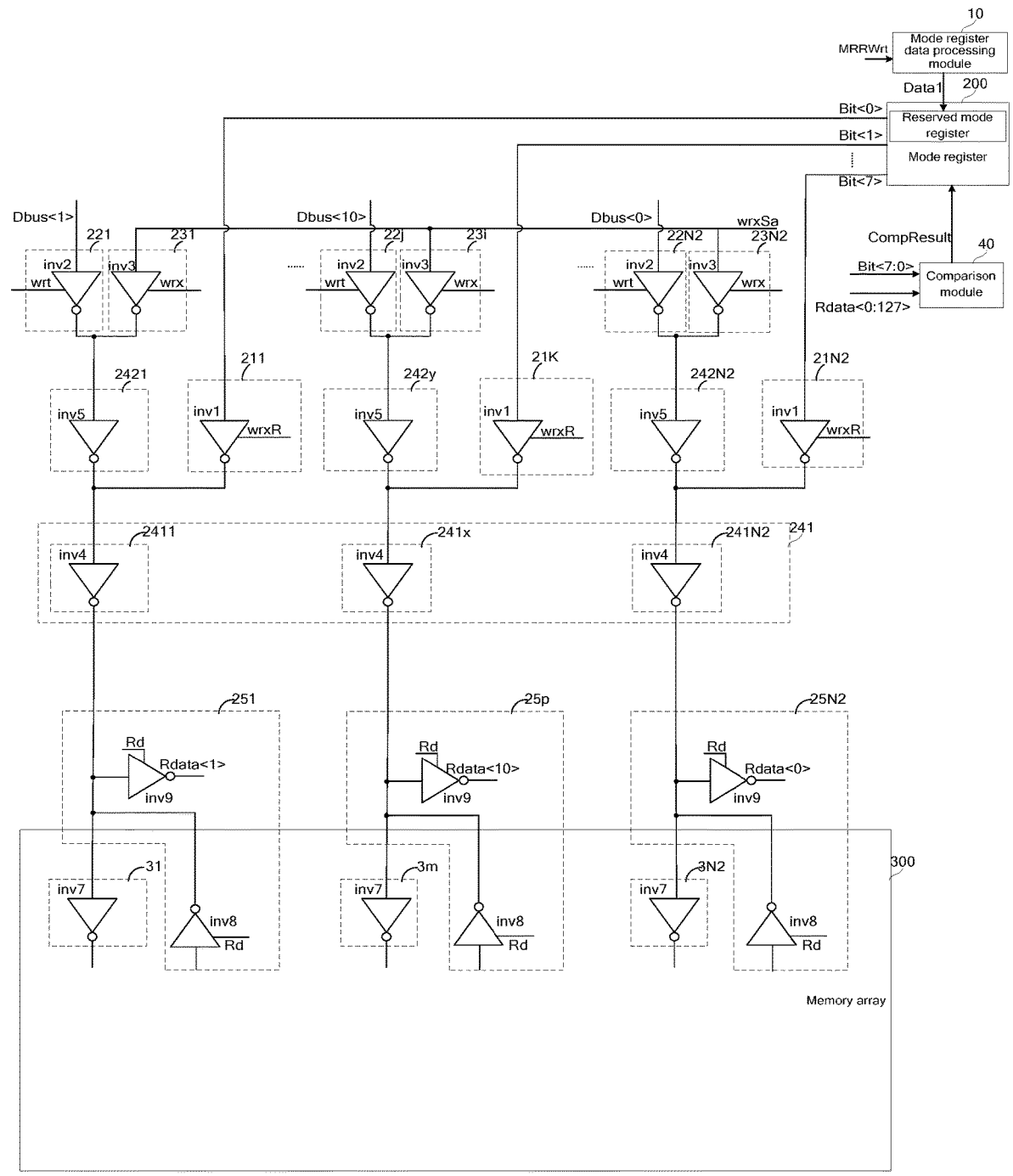
FIG. 10B is a second schematic diagram of a circuit corresponding to the embodiment shown in FIG. 5.

In some exemplary implementations, please referring to FIG. 10A and FIG. 10B, the first general data transmission module includes a first inverter inv4, and the first gating inverter inv1 is electrically connected to the internal data transmission module 30 via the first inverter inv4. The second general data transmission module includes a second inverter inv5, and both an output terminal of the second gating inverter inv2 and an output terminal of the third gating inverter inv3 are electrically connected to an input terminal of the first inverter inv4 via the second inverter inv5. This embodiment is convenient to achieve the function of writing arbitrary target data into the memory array by means of the existing functional elements inside the specific application circuit, which reduces the circuit cost and is suitable for the actual needs of various different application scenarios.

Figure 11A:
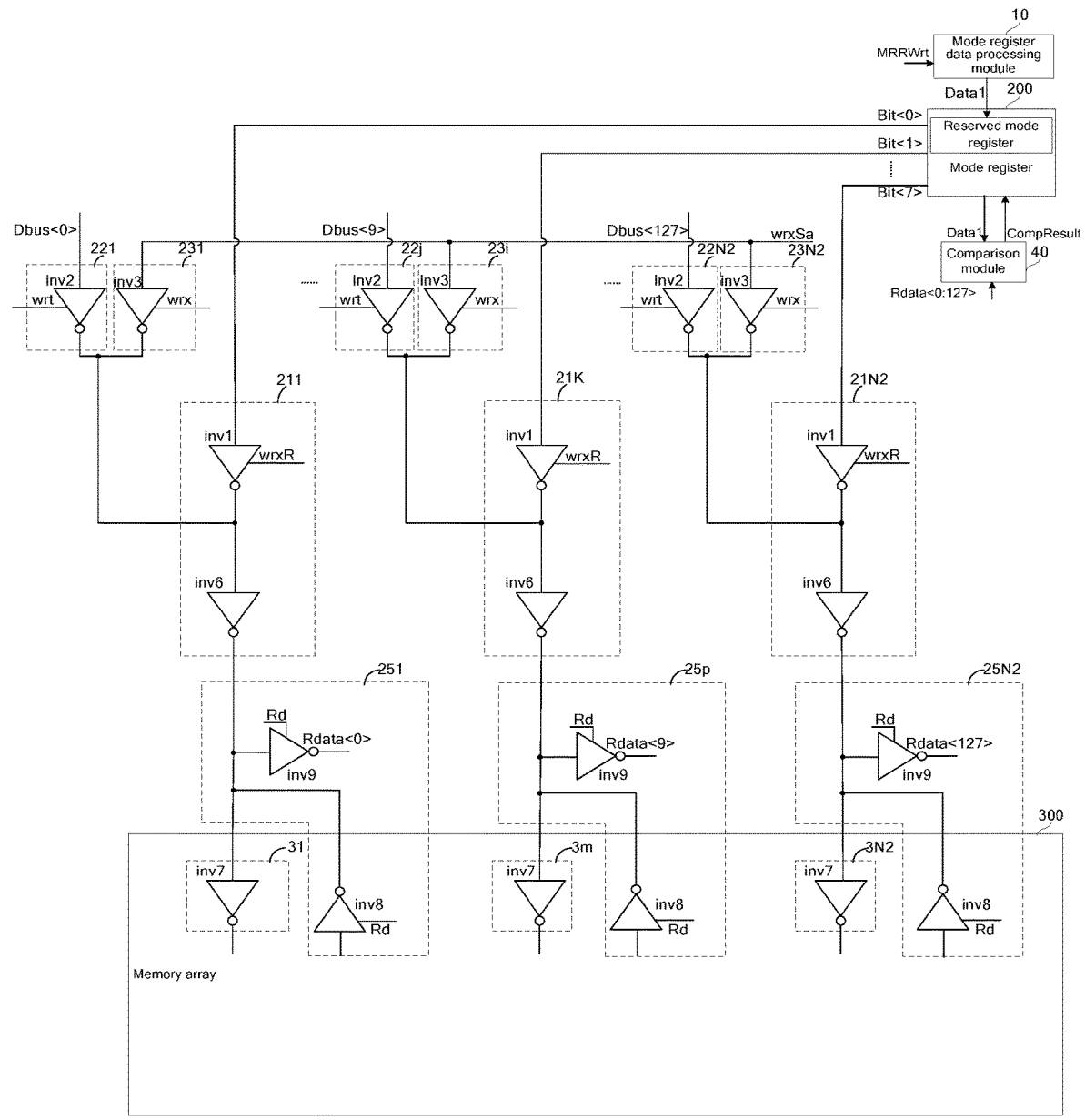
FIG. 11A is a first schematic diagram of a circuit corresponding to the embodiment shown in FIG. 3.
Figure 11B:
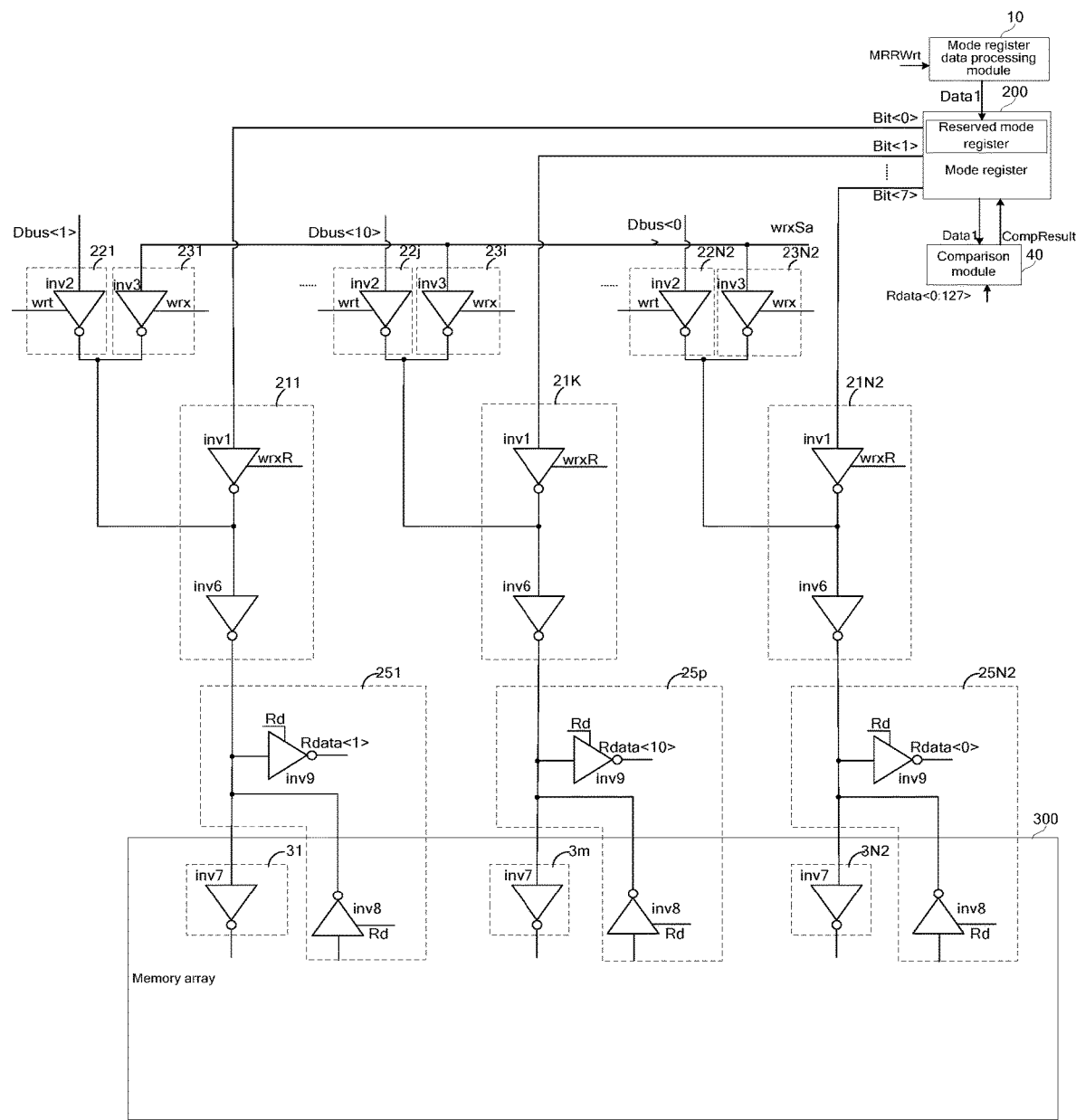
FIG. 11B is a second schematic diagram of a circuit corresponding to the embodiment shown in FIG. 3.

In some exemplary implementations, please referring to FIG. 11A and FIG. 11B, the preset data transmission unit further includes a third inverter inv6 provided with an input terminal electrically connected to an output terminal of the first gating inverter inv1, an output terminal of the second gating inverter inv2, and an output terminal of the third gating inverter inv3, and an output terminal connected to an input terminal of the internal data transmission module 30. This embodiment is convenient to achieve the function of writing arbitrary target data into the memory array by means of the existing functional elements inside the specific application circuit, which reduces the circuit cost and is suitable for the actual needs of various different application scenarios.

One embodiment of the present disclosure provides a memory device, including a memory array, a mode register, and the detection circuit in any embodiment of the present disclosure. Since the reserved mode register in the mode register and the conventional mode register write enable command MRRWrt are configured to complete the function of writing the initial data into the memory array, and the content of the target data can be changed by setting different encoding rules, the function of writing arbitrary data into the memory array without a data strobe clock signal (WCK) or a data clock signal (DQ) and without increasing the complexity of a circuit structure is achieved, thereby effectively improving the storage performance of a semiconductor memory device. Since a low-power-consumption write function of the enable signal is used, this embodiment reduces the energy consumption of data transmission on the premise of ensuring the storage capacity of the semiconductor memory device. This embodiment can intelligently detect whether the memory array is abnormal during data transmission, and store a detection result to the preset position in the mode register, so that it is convenient to analyze the failed bits in the memory array according to the detection result stored in the mode register, thereby improving the utilization efficiency and working reliability of the semiconductor memory chips.

In some exemplary implementations, the write enable command and the data strobe clock signal (WCK) can be set to be inverted signals of each other, so that during a period of writing data into the memory array using the data strobe clock signal, the low-power-consumption write function of the write enable command is mutually exclusive.

Figure 12:
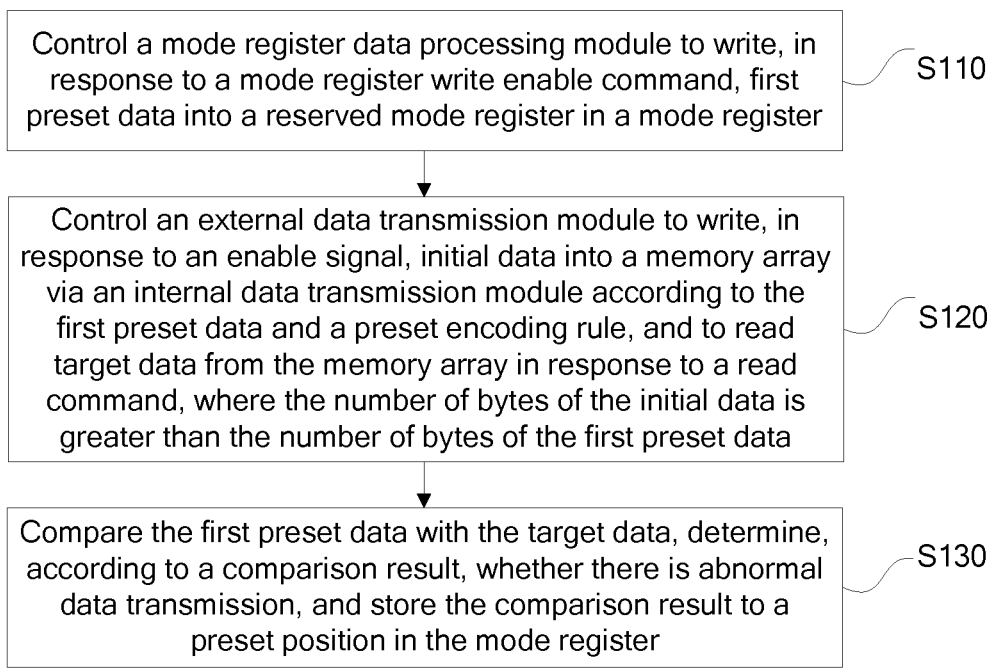
FIG. 12 is a flow diagram of a detection method according to one embodiment of the present disclosure.

Please referring to FIG. 12, some embodiments of the present disclosure provide a detection method, including:

Step S110, control a mode register data processing module to write, in response to a mode register write enable command, first preset data into a reserved mode register in a mode register;

Step S120, control an external data transmission module to write, in response to an enable signal, initial data into a memory array via an internal data transmission module according to the first preset data and a preset encoding rule, and to read target data from the memory array in response to a read command, where the number of bytes of the initial data is greater than the number of bytes of the first preset data; and Step S130, compare the first preset data with the target data, determine whether there is abnormal data transmission based on a comparison result, and store the comparison result to a preset position in the mode register.

Specifically, by intelligently detecting whether the memory array is abnormal during data transmission, and storing a detection result to the preset position in the mode register, it is convenient to analyze the failed bits in the memory array according to the detection result stored in the mode register, thereby improving the utilization efficiency and working reliability of the semiconductor memory chips. In this embodiment, after the initial data is written into the reserved mode register in the mode register by using the mode register write enable command, the target data written into the memory array is changed through the low-power-consumption write function of the enable signal by changing the preset encoding rule, thereby achieving the function of writing arbitrary data into the memory array without a data strobe clock signal or a data clock signal. Compared with the traditional write function using the write enable command, which can only write all "0" or all "1" into the memory array, this embodiment effectively improves the storage performance of the semiconductor memory device. Since the low-power-consumption write function of the enable signal is used, this embodiment reduces the energy consumption of data transmission on the premise of ensuring the storage capacity of the semiconductor memory device.

In some exemplary implementations, the number of bytes of the first preset data is N1; and the number of bytes of the initial data is N2. The external data transmission module includes N2 preset data transmission units. Each bit of data of the first preset data is electrically connected to an input terminal of the internal data transmission module via corresponding N3 preset data transmission units, where N3=N2/N1; and N1, N2, and N3 are all positive integers, thereby reducing the complexity of writing the target data into the memory array according to the initial data. The data transmitted by the N3 preset data transmission units corresponding to any bit of data of the first preset data can be set to be equal to reduce the complexity of the circuit structure, thereby reducing the production cost of the circuit and improving the operating reliability of the circuit.

In some exemplary implementations, the number of the preset data transmission units corresponding to at least two bits of data of the first preset data is different, thereby improving the richness of encoding rules, and adapting to various different application scenarios.

According to the memory device or the detection method in the foregoing embodiments, by intelligently detecting whether the memory array is abnormal during data transmission, and storing a detection result to the preset position in the mode register, it is convenient to analyze the failed bits in the memory array according to the detection result stored in the mode register, thereby improving the utilization efficiency and working reliability of the semiconductor memory chips. In this embodiment, after the initial data is written into the reserved mode register in the mode register by using the mode register write enable command, the target data written into the memory array is changed through the low-power-consumption write function of the enable signal by changing the preset encoding rule, thereby achieving the function of writing arbitrary data into the memory array without a data strobe clock signal or a data clock signal. Compared with the traditional write function using the write enable command, which can only write all "0" or all "1" into the memory array, this embodiment effectively improves the storage performance of the semiconductor memory device. Since the low-power-consumption write function of the enable signal is used, this embodiment reduces the energy consumption of data transmission on the premise of ensuring the storage capacity of the semiconductor memory device.

For specific limitations of the detection method in the embodiments of the present disclosure, reference may be made to the specific limitations about the detection circuit in the foregoing embodiments, and details are not described herein again.

It should be understood that although the steps in the flowchart of FIG. 12 are sequentially displayed according to the arrows, these steps are not necessarily performed in the order indicated by the arrows. Unless clearly described otherwise, the execution order of the steps is not strictly limited, and these steps may be executed in other orders. Moreover, at least some of the steps in FIG. 12 may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

Those of ordinary skill in the art may understand that all or some of the procedures in the methods of the above embodiments may be implemented by a computer program instructing related hardware. The computer program may be stored in a non-volatile computer-readable storage medium. When the computer program is executed, the procedures in the embodiments of the above methods may be performed. Any reference to a memory, a storage, a database, or other media used in the embodiments of the present disclosure may include a non-volatile and/or volatile memory. The nonvolatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache memory. As description rather than limitation, the RAM can be obtained in a plurality of forms, such as a static random access memory (SRAM), a dynamic RAM (DRAM), a synchronous DRAM (SDRAM), a double data rate SDRAM (DDRSDRAM), an enhanced SDRAM (ESDRAM), a synchronous link (Sync Link) DRAM (SLDRAM), a memory bus (Rambus) dynamic RAM (RDRAM), a direct memory bus dynamic RAM (DRDRAM), and a memory bus dynamic RAM (RDRAM).

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

In the detection circuit, the detection method and the memory device provided by embodiments of the present disclosure, by intelligently detecting whether the memory array is abnormal during data transmission, and storing a detection result to the preset position in the mode register, it is convenient to analyze failed bits in the memory array according to the detection result stored in the mode register, thereby improving the utilization efficiency and working reliability of the memory device.

What is claimed is:

1. A detection circuit, comprising a mode register data processing module, an external data transmission module, a comparison module, and an internal data transmission module provided in a memory array, wherein
the mode register data processing module is configured to write, in response to a mode register write enable command, first preset data into a reserved mode register in a mode register;
the external data transmission module is electrically connected to both the reserved mode register and the internal data transmission module, is configured to write, in response to an enable signal, initial data into the memory array via the internal data transmission module according to the first preset data and a preset encoding rule, and is further configured to read target data from the memory array in response to a read command, wherein a number of bytes of the initial data is greater than a number of bytes of the first preset data; and
the comparison module is electrically connected to both the mode register and the external data transmission module, and is configured to compare the first preset data with the target data, determine whether there is an abnormal data transmission based on a comparison result, and store the comparison result to a preset position in the mode register.

2. The detection circuit according to claim 1, wherein the comparison module is configured to:
generate the initial data according to the first preset data and the preset encoding rule, compare the initial data with the target data, and determine whether there is an abnormal data transmission based on a comparison result, wherein the number of bytes of the initial data is associated with a number of bytes of the target data.

3. The detection circuit according to claim 2, wherein the number of bytes of the initial data is equal to the number of bytes of the target data; and the comparison module is further configured to:
compare the initial data and the target data bit by bit, and if the initial data and the target data are equal in each bit, determine that a data transmission is normal; and otherwise, determine that the data transmission is abnormal.

4. The detection circuit according to claim 1, wherein the number of bytes of the first preset data is N1; the number of bytes of the initial data is N2; the external data transmission module comprises a preset data transmission module comprising the N2 preset data transmission units; and
each bit of data of the first preset data is electrically connected to an input terminal of the internal data transmission module via corresponding N3 preset data transmission units, wherein
the N3=the N2/the N1; and
the N1, the N2, and the N3 are all positive integers.

5. The detection circuit according to claim 4, wherein the enable signal comprises a write enable command; and each of the preset data transmission units comprises:
a first gating inverter, provided with an input terminal electrically connected to the reserved mode register, an output terminal electrically connected to the input terminal of the internal data transmission module, or electrically connected to the input terminal of the internal data transmission module via a general data transmission module, and a control terminal for receiving the write enable command, and configured to write, in response to the write enable command, the target data into the memory array via the internal data transmission module according to the initial data received and the preset encoding rule.

6. The detection circuit according to claim 5, wherein data transmitted by the N3 preset data transmission units corresponding to any bit of data of the first preset data are equal; or a number of preset data transmission units corresponding to at least two bits of data of the first preset data is different.

7. The detection circuit according to claim 5, wherein the enable signal further comprises a write enable signal; the external data transmission module further comprises a first data transmission module comprising first data transmission units, wherein a number of the first data transmission units is equal to the number of bytes of the initial data; and the first data transmission unit is provided with an input terminal electrically connected to a corresponding data bus, an output terminal electrically connected to the internal data transmission module, or electrically connected to the internal data transmission module via the preset data transmission module or the general data transmission module, and a control terminal for receiving the write enable signal, and is configured to provide, in response to the write enable signal, corresponding data to the internal data transmission module according to data provided by the corresponding data bus.

8. The detection circuit according to claim 7, wherein the first data transmission unit comprises:

a second gating inverter, provided with an input terminal electrically connected to the corresponding data bus, an output terminal electrically connected to the internal data transmission module, or electrically connected to the internal data transmission module via the preset data transmission module or the general data transmission module, and a control terminal for receiving the write enable signal, and configured to provide, in response to the write enable signal, the corresponding data to the internal data transmission module according to the data provided by the corresponding data bus.

9. The detection circuit according to claim 8, wherein the enable signal further comprises a low-power-consumption write enable signal; the external data transmission module further comprises a second data transmission module comprising second data transmission units, wherein a number of the second data transmission units is equal to the number of bytes of the initial data; and the second data transmission unit is provided with an input terminal electrically connected to a corresponding low-power-consumption data line, an output terminal electrically connected to the internal data transmission module, or electrically connected to the internal data transmission module via the preset data transmission module or the general data transmission module, and a control terminal for receiving the low-power-consumption write enable signal, and is configured to provide, in response to the low-power-consumption write enable signal, corresponding data to the internal data transmission module according to data provided by the corresponding low-power-consumption data line.

10. The detection circuit according to claim 9, wherein the second data transmission unit comprises:

a third gating inverter, provided with an input terminal electrically connected to the corresponding low-power-consumption data line, an output terminal electrically connected to the internal data transmission module, or electrically connected to the internal data transmission module via the preset data transmission module or the general data transmission module, and a control terminal for receiving the low-power-consumption write enable signal, and configured to provide, in response to the low-power-consumption write enable signal, the corresponding data to the internal data transmission module according to the data provided by the corresponding low-power-consumption data line.

11. The detection circuit according to claim 10, wherein the general data transmission module comprises:

a first general data transmission module, provided with a first input terminal connected to an output terminal of the preset data transmission module and an output terminal connected to the input terminal of the internal data transmission module; and a second general data transmission module, provided with a first input terminal connected to an output terminal of the first data transmission module, a second input terminal connected to an output terminal of the second data transmission module, and an output terminal connected to a second input terminal of the first general data transmission module.

12. The detection circuit according to claim 11, wherein the first general data transmission module comprises a first inverter, and the preset data transmission module is electrically connected to the internal data transmission module via the first inverter; and/or the second general data transmission module comprises a second inverter, and the first data transmission module is electrically connected to an input terminal of the first inverter via the second inverter.

13. The detection circuit according to claim 12, wherein the preset data transmission unit further comprises:

a third inverter, provided with an input terminal connected to the output terminal of the first gating inverter, the output terminal of the first data transmission unit, and the output terminal of the second data transmission unit, and an output terminal connected to the input terminal of the internal data transmission module.

14. The detection circuit according to claim 11, wherein the first general data transmission module and/or the second general data transmission module are located inside the memory array.

15. The detection circuit according to claim 13, wherein the internal data transmission module comprises internal data transmission units, wherein a number of the internal data transmission units is equal to a number of bytes of the target data; and the internal data transmission unit comprises:

a fourth inverter, provided with an input terminal connected to the output terminal of the first gating inverter, the output terminal of the second gating inverter, and the output terminal of the third gating inverter, or connected to an output terminal of the first inverter, or connected to the output terminal of the third inverter, and an output terminal connected to the memory array.

16. The detection circuit according to claim 10, wherein the external data transmission module further comprises a read module comprising read units, wherein a number of the read units is equal to the number of bytes of the initial data; and the read unit is configured to read the target data from the memory array in response to the read command and transmit the target data to the comparison module.

17. The detection circuit according to claim 16, wherein the read unit comprises:

a fourth gating inverter, provided with an input terminal electrically connected to the memory array, and a control terminal for receiving the read command; and a fifth gating inverter, provided with an input terminal electrically connected to an output terminal of the fourth gating inverter, an output terminal electrically connected to an input terminal of the comparison module, and a control terminal for receiving the read command.

18. A memory device, comprising:
a memory array;
a mode register; and
the detection circuit according to claim 1.

19. A detection method, comprising:

controlling a mode register data processing module to write, in response to a mode register write enable command, first preset data into a reserved mode register in a mode register;

controlling an external data transmission module to write, in response to an enable signal, initial data into a memory array via an internal data transmission module according to the first preset data and a preset encoding rule, and to read target data from the memory array in response to a read command, wherein a number of bytes of the initial data is greater than a number of bytes of the first preset data; and comparing the first preset data with the target data, determining whether there is an abnormal data transmission based on a comparison result, and storing the comparison result to a preset position in the mode register.

20. The method according to claim 19, wherein the number of bytes of the first preset data is N1; the number of bytes of the initial data is N2; the external data transmission module comprises the N2 preset data transmission units; and each bit of data of the first preset data is electrically connected to an input terminal of the internal data transmission module via corresponding N3 preset data transmission units, wherein the N3=the N2/the N1; and the N1, the N2, and the N3 are all positive integers;

wherein data transmitted by the N3 preset data transmission units corresponding to any bit of data of the first preset data are equal; or a number of preset data transmission units corresponding to at least two bits of data of the first preset data is different.

* * * * *